(12) United States Patent
Tomura et al.

(10) Patent No.: US 8,108,161 B2
(45) Date of Patent: Jan. 31, 2012

(54) STATE ESTIMATING DEVICE OF SECONDARY BATTERY

(75) Inventors: Shuji Tomura, Nagoya (JP); Takaji Umeno, Nisshin (JP); Yasushi Amano, Aichi-ken (JP); Yuji Nishi, Nagoya (JP); Takeshi Takemoto, Nagoya (JP); Nobuyasu Haga, Seto (JP); Tetsuya Fuchimoto, Nagoya (JP)

(73) Assignees: Kabushiki Kaisha Toyota Chuo Kenkyusho, Aichi-Gun (JP); Toyota Jidosha Kabushiki Kaisha, Toyota (JP)

( * ) Notice: Subject to any disclaimer, the term of this patent is extended or adjusted under 35 U.S.C. 154(b) by 362 days.

(21) Appl. No.: 12/449,390

(22) PCT Filed: Mar. 13, 2008

(86) PCT No.: PCT/JP2008/055164
§ 371 (c)(1),
(2), (4) Date: Aug. 6, 2009

(87) PCT Pub. No.: WO2008/117732
PCT Pub. Date: Oct. 2, 2008

(65) Prior Publication Data
US 2010/0153038 A1 Jun. 17, 2010

(30) Foreign Application Priority Data
Mar. 23, 2007 (JP) .................................. 2007-077597

(51) Int. Cl.
*G01R 31/36* (2006.01)
(52) U.S. Cl. .......... 702/63; 324/426; 324/427; 324/431; 324/433; 320/134; 320/136; 320/48; 320/132; 320/150; 340/636.15; 340/636.19

(58) Field of Classification Search .................... 702/63; 324/426, 427, 428, 429, 431, 433, 435; 320/32, 320/43, 48, 124, 134, 136, 132, 133, 150, 320/161, 153, 152; 340/636.15, 636.19; 180/65.29
See application file for complete search history.

(56) References Cited

U.S. PATENT DOCUMENTS
4,626,765 A 12/1986 Tanaka
(Continued)

FOREIGN PATENT DOCUMENTS
JP A-8-138759 5/1996
(Continued)

OTHER PUBLICATIONS
Sep. 14, 2010 Office Action issued in Japanese Patent Application No. 2007-077597 (with translation).
(Continued)

*Primary Examiner* — Carol Tsai
(74) *Attorney, Agent, or Firm* — Oliff & Berridge, PLC

(57) ABSTRACT

A battery state estimating unit estimates an internal state of a secondary battery according to a battery model equation in every arithmetic cycle, and calculates an SOC based on a result of the estimation. A parameter characteristic map stores a characteristic map based on a result of actual measurement performed in an initial state (in a new state) on a parameter diffusion coefficient and a DC resistance in the battery model equation. The parameter change rate estimating unit estimates a DC resistance change rate represented by a ratio of a present DC resistance with respect to a new-state parameter value by parameter identification based on the battery model equation, using battery data measured by sensors as well as the new-state parameter value of the DC resistance corresponding to the present battery state and read from the parameter characteristic map.

25 Claims, 14 Drawing Sheets

U.S. PATENT DOCUMENTS

| | | | | |
|---|---|---|---|---|
| 5,675,258 | A * | 10/1997 | Kadouchi et al. | 324/433 |
| 5,886,527 | A * | 3/1999 | Ito | 324/431 |
| 6,191,556 | B1 * | 2/2001 | Galbraith et al. | 320/132 |
| 6,271,647 | B2 * | 8/2001 | Galbraith et al. | 320/132 |
| 6,876,175 | B2 * | 4/2005 | Schoch | 320/132 |
| 7,136,762 | B2 * | 11/2006 | Ono | 702/63 |
| 7,593,821 | B2 * | 9/2009 | Plett | 702/63 |
| 7,800,375 | B2 * | 9/2010 | Plett | 324/426 |
| 7,965,059 | B2 * | 6/2011 | Plett | 320/132 |
| 7,994,755 | B2 * | 8/2011 | Plett | 320/132 |
| 2003/0184307 | A1 * | 10/2003 | Kozlowski et al. | 324/427 |
| 2006/0284617 | A1 * | 12/2006 | Kozlowski et al. | 324/426 |
| 2009/0261837 | A1 * | 10/2009 | Plett | 324/429 |
| 2010/0033132 | A1 * | 2/2010 | Nishi et al. | 320/136 |
| 2011/0161025 | A1 * | 6/2011 | Tomura et al. | 702/63 |

FOREIGN PATENT DOCUMENTS

| | | |
|---|---|---|
| JP | A-2003-75518 | 3/2003 |
| JP | A-2007-323999 | 12/2007 |

OTHER PUBLICATIONS

Fuller et al.; "Simulation and Optimization of the Dual Lithium Ion Insertion Cell;" *Journal of Electrochemical Society*; Jan. 1994; pp. 1-10; vol. 141, No. 1.

Gu et al.; "Thermal-Electrochemical Coupled Modeling of a Lithium-Ion Cell;" *ECS Proceedings*; 2000; pp. 748-762; vol. 99-25, No. 1.

U.S. Appl. No. 12/447,715 filed on Apr. 29, 2009 in the name of Nishi, et al.

* cited by examiner

STATE ESTIMATING DEVICE OF SECONDARY BATTERY

CROSS-REFERENCE TO RELATED APPLICATIONS

This application is the US National Stage of International Application No. PCT/JP2008/055164 filed Mar. 13, 2008 and claims the benefit thereof. The International Application claims the benefits of Japan application No. 2007-077597 JP filed Mar. 23, 2007, both of the applications are incorporated by reference herein in their entirety.

TECHNICAL FIELD

The invention relates to a state estimating device of a secondary battery, and particularly to a state estimating device of a secondary battery according to a battery model which allows dynamic estimation of an internal state of the secondary battery.

BACKGROUND ART

There have been used power supply systems configured such that a chargeable and dischargeable secondary battery can supply a power to a load and the secondary battery can be charged even during an operation of the load when necessary. Typically, this kind of power supply systems are mounted on hybrid vehicles and electric vehicle that employ an electric motor driven by the secondary battery as a drive power source.

In this power supply system, an accumulated electric power of the secondary battery is used as a drive electric power of an electric motor that is a drive power source. Also, the secondary battery is charged with powers such as an electric power generated by regeneration of this electric motor and an electric power generated by an electric generator that generates the power according to rotation of an engine. In this kind of power supply system, a state estimating device of a secondary battery is typically required to obtain correctly an SOC (State Of Charge) with respect to a fully charged state. More specifically, it is necessary to restrict excessive charging and discharging of the secondary battery by successively and accurately estimating the SOC of the secondary battery even during the charging/discharging and immediately after the charging/discharging. Battery parameters (internal resistance and others) of the secondary battery gradually change and deteriorate with use so that it is required to estimate accurately the state of the secondary battery corresponding to the secular change.

For example, Japanese Patent Laying-Open No. 2003-075518 (which will be referred to as a "Patent Document 1") has disclosed an SOC estimating device of a secondary battery in which parameters relating to a battery model represented as a linear equalization circuit is collectively or simultaneously estimated by applying an adaptive digital filter to the battery model, an internal battery resistance or a battery time constant is obtained from the estimated parameters, and a degree of the battery deterioration can be estimated based on prestored map data of the battery-internal resistance and the SOC or prestored map data of the battery time constant and the SOC.

In the SOC estimating device of the secondary battery disclosed in the Patent Document 1, as can be seen from FIG. 3 thereof, an RC parallel circuit formed of a resistance R1 representing a pure electric resistance, a charge-transfer resistance R2 and an electric double layer capacitance C1 is used as an equalization circuit model. In this equalization circuit model, changes in voltage caused by diffusion of a reaction-articipating material are approximately represented due a response delay caused by the RC parallel circuit so that it is practically difficult to achieve a sufficiently high accuracy with consideration given to the diffusion of the reaction-participating material inside the secondary battery.

In T. F. Fuller, M. Doyle and J. Newman "Simulation and Optimization of the Dual Lithium Ion Insertion Cell", J. Electrochem. Soc., Vol. 141, No. 1 (1994), pp. 1-10 and W. B. Gu and C. Y. Wang "Thermal-Electrochemical Coupled Modeling of a Lithium-Ion Cell", ECS Proceedings, Vol. 99-25 (1), 2000, pp. 748-762, which will be referred to as Non-Patent Documents 1 and 2, respectively, studies are made on cell models based on electrochemical reactions inside lithium-ion cells, and it is reported that cell characteristics can be precisely expressed by a comparison with actual cells. Particularly, Non-Patent Documents 1 and 2 have disclosed that an open-circuit voltage of a secondary battery depends on a local SOC at an electrolyte interface (active material surface), and consequently a battery voltage in a relaxation state is governed by diffusion of lithium that depends on a lithium concentration distribution in the active material. Particularly, the diffusion of the reaction-participating material (lithium) in the active material is governed by a diffusion equation of polar coordinates handling the active materials as spheres, and a diffusion rate of the material during a diffusion processing is governed by a diffusion coefficient.

In the battery model of the linear equalization circuit disclosed in the Patent Document 1, the changes in voltage due to diffusion of the reaction-participating material are approximately represented by the response delay due to the RC parallel circuit. Therefore, an RC ladder circuit formed of a series connection of a plurality of RC parallel circuits is required for obtaining a sufficiently high estimation accuracy expressing the actual diffusion process. However, when the RC ladder circuit is used as the equalization circuit model, the number of parameters to be estimated by the adaptive digital filter increases, which results in a problem of increase in arithmetic quantity and an insufficient estimation accuracy.

Further, in the Patent Document 1, the adaptive digital filter is used for estimating the battery parameters. However, the battery parameters significantly change depending on the battery states such as a battery temperature and an SOC. Therefore, it is preferable for estimating the degree of battery deterioration to estimate only the changes of parameters that change relatively slowly due to the secular change and thus have large time constants. However, it is actually configured to estimate also the changes of parameters that change relatively rapidly due to changes in battery state and thus have small time constants. For performing the estimation while following the battery parameters that change rapidly, therefore, it is necessary to take measures such that a device employs a plurality of open-circuit voltage estimating units having different arithmetic periods, respectively, and thereby inappropriate open-circuit voltage estimating units are successively initialized depending on the battery temperature. This results in a problem of increase in arithmetic quantity and storage capacitance. Further, when the battery parameters that change rapidly are estimated, such a problem Occur that a delay in estimation and a large estimation error due to noises or the like are liable to occur, and it may be impossible to ensure the state estimation accuracy of the battery model by appropriately updating the parameter values reflecting identification results and to execute appropriately the deterioration estimation based on the identification result values.

Further, in the Patent Document 1, the adaptive digital filter arithmetic is performed to estimate collectively the parameters of the battery model from the current and voltage, and the battery-internal resistance and time constant are obtained using the result of this estimation. However, when it is attempted to obtain simultaneously the battery-internal resistance and the time constant affected by the diffusion rate of the reaction-participating material, appropriate identification may be impossible. More specifically, the identification may be erroneously performed such that the battery-internal resistance has increased, in spite of the fact that the time constant has increased due to deterioration of the battery. Conversely, the identification may be erroneously performed such that the time constant has increased, in spite of the fact that the internal resistance has actually increased. Therefore, when the degree of battery deterioration is to be estimated based on the battery-internal resistance and the time constant obtained in the above manner, a deterioration determining method may become complicated for avoiding erroneous determination of the deterioration.

Conversely, in the Non-Patent Documents 1 and 2, the diffusion of the reaction-participating material is expressed by the diffusion equation based on the electrochemical reaction inside the battery, and it is considered that the open-circuit voltage of the battery depends on the local SOC in the electrode-electrolyte interface (active material surface). In this case, the battery model becomes nonlinear, but the battery-internal state can be estimated more accurately. However, for estimating the degree of battery deterioration using this battery model, the diffusion coefficient governing the diffusion of the reaction-participating material must be estimated together with DC resistance components such as a pure resistance and a charge-transfer resistance.

However, the adaptive digital filter disclosed in the Patent Document 1 cannot be applied to the nonlinear model as it is. A nonlinear adaptive digital filter (extended Karman filter or the like) that allows parameter identification can be applied to the nonlinear model, but this results in problems such as an extremely large quantity of arithmetic.

DISCLOSURE OF THE INVENTION

The present invention has been developed for overcoming the above problems, and an object of the invention is to provide a state estimating device of a secondary battery for estimating a state quantity of the secondary battery according to a battery model, and particularly to prevent degrading of an estimation accuracy due to an influence by changes in parameter value corresponding to changes in battery state when parameter identification in a battery model equation is performed, and thereby to ensure an estimation accuracy of the battery model corresponding to secular change of the battery.

A state estimating device of a secondary battery according to the invention includes a detecting unit, a battery state estimating unit, a storing unit and a change rate estimating unit. The detecting unit detects a voltage, a current and a temperature of the secondary battery. The battery state estimating unit successively estimates a state quantity of the secondary battery according to a battery model equation based on at least one of the battery temperature and the battery voltage, and the battery current detected by the detecting unit. The storing unit prestores data relating to change characteristics of an initial state parameter value of the secondary battery with respect to changes in battery state in connection with a predetermined parameter of parameters used in the battery model equation. The change rate estimating unit performs parameter identification based on the battery model equation using the battery temperature, the battery voltage and the battery current detected by the detecting unit as well as the initial state parameter value corresponding to the present battery state based on the data read from the storing unit, and thereby estimates a parameter change rate being a ratio of a present parameter value with respect to the initial state parameter value in connection with the predetermined parameter.

According to the above state estimating device of the secondary battery, in connection with the predetermined parameter in the battery model equation, the change rate of the parameter value in the initial state (typically, in a new state) can be estimated independently of significant changes in parameter value caused by changes in battery state such as a temperature, an SOC and the like. Consequently, it is possible to eliminate an influence exerted by significant and rapid changes (i.e., of small time constants) caused by the changes in battery state, and the secular change in parameter value due to secular deterioration of the battery can be stably estimated so that the parameter identification can be performed while avoiding a delay in estimation and deterioration of the estimation accuracy.

Preferably, the battery state estimating unit executes the estimation of the state quantity of the secondary battery according to the battery model equation, for the predetermined parameter in the battery model equation, using values obtained by multiplying the parameter change rate estimated by the change rate estimating unit and the initial state parameter value corresponding to the battery state.

Thereby, the secular change of the parameter value can be appropriately reflected in the battery model equation. Therefore, even when the deterioration and/or manufacturing variations occur in the battery, the state of the secondary battery can be accurately estimated.

Preferably, the state estimating device of the secondary battery further includes a deterioration degree estimating unit. The deterioration degree estimating unit estimates a degree of deterioration of the secondary battery based on the parameter change rate estimated by the change rate estimating unit.

Thereby, in view of the fact that the parameter change rate directly indicates the secular change of the predetermined parameter value and the degree of the charge deterioration, the degree of the battery deterioration can be directly and simply estimated without using a further map or the like.

Preferably, the predetermined parameter is a parameter expressing a DC resistance of the secondary battery, and the change rate estimating unit successively estimates the parameter change rate by using, as its input/output, a state quantity obtained from the battery model equation and from the battery temperature, the battery current and the battery voltage detected by the detecting unit, and by employing a least-square method in a linear regression model equation using the change rate as an estimation parameter.

Further preferably, a parameter expressing the DC resistance is represented as a function of the battery temperature and a local SOC based on an estimated value of a reaction-participating material concentration at an interference of an active material in an electrode of the secondary battery estimated by the battery state estimating unit.

Thereby, applying the least-square method to the linear model equation based on the battery data and the state quantity obtained from the nonlinear model, the parameter change rate can be successively estimated. Therefore, the change rate of the parameter value with respect to the initial state can be estimated independently of the significant changes in parameter value that may occur due to changes in battery state.

Further preferably, the change rate estimating unit estimates the parameter change rate by a recursive least-square method employing a forgetting coefficient for reducing a weight of past data relatively to that of present data.

By employing the recursive least-square method employing the forgetting coefficient, the parameter change rate can be estimated with the present measured data weighted heavily than the past measured data. Therefore, the parameter change rate can be estimated while following any changing of the battery state.

Further preferably, the change rate estimating unit stops the estimation of the parameter change rate when an absolute value of the battery current detected by the detecting unit is larger than a first reference value or when the absolute value of the battery current is smaller than a second reference value smaller than the first reference value.

Thereby, the current range for identifying the parameter change rate of the DC resistance can be determined to exclude a battery-relaxation state and a state of charging/discharging with a large current. Thereby, it is possible to prevent erroneous estimation of any change in diffusion resistance of the secondary battery due to deterioration as a change in DC resistance.

Further preferably, a parameter expressing the DC resistance includes a charge-transfer resistance and a pure electric resistance inside the secondary battery, and the change rate estimating unit successively estimates the parameter change rates of the charge-transfer resistance and the electric resistance independently of each other.

Particularly, it is preferable that the charge-transfer resistance is represented as a function of the battery temperature and a local SOC based on an estimated value of a reaction-participating material concentration at an interference of an active material in an electrode of the secondary battery estimated by the battery state estimating unit, and the pure electric resistance is represented as a function of the battery temperature.

Thereby, the DC resistance is divided into the charge-transfer resistance caused by the reaction at the active material interface and the pure electric resistance occurring at the electrode and the like, and thereby the parameter change rate can be estimated. Therefore, the parameter identification for the DC resistance can be executed more accurately. When the DC resistance increases, it is possible to specify the charge-transfer resistance or the pure electric resistance as the increasing resistance so that the deterioration mode of the battery can be determined.

Preferably, the battery model equation includes a voltage equation expressed by an open-circuit voltage being a function of a reaction-participating material concentration at a surface of an active material inside the secondary battery and an overvoltage depending on the current, and a diffusion equation defining a distribution of the reaction-participating material concentration inside the active material.

Thereby, the diffusion equation performing definition according to the physical law can express the dependence of the open-circuit voltage on the reaction-participating material concentration at the surface of the active material and the diffusion process of the reaction-participating material concentration inside the active material so that the internal state of the battery can be precisely estimated.

Preferably, the change rate estimating unit stops the estimation of the parameter change rate when an absolute value of a difference between the reaction-participating material concentration at the surface of the active material and an average value of the reaction-participating material concentration inside the active material is larger than a predetermined value, or before a predetermined time elapses after the absolute value of the concentration difference becomes smaller than the predetermined value.

Thereby, it is possible to determine whether the estimation of the change rate of the DC resistance is allowed or not, from the reaction-participating material concentration distribution in the active material model inside the battery model. Consequently, such a situation can be prevented that the change rate of the DC resistance is estimated using the battery data in the battery operating state where a large influence by the diffusion resistance appears. Therefore, it is possible to prevent such a situation that the change in diffusion resistance due to deterioration is erroneously determined as the changes in DC resistance.

Preferably, the predetermined parameter includes a diffusion parameter expressing a diffusion speed of a reaction-participating material in an active material of the secondary battery. The state estimating device further includes an estimation data (i.e., data for estimation) storing unit. The data storing unit successively stores, as a time-series data array, the battery data of each of the battery voltage, the battery current and the battery temperature detected by the detecting unit during a data storage period defined according to a predetermined condition. Further, the change rate estimating unit includes a battery model arithmetic unit and an estimation processing unit. The battery model arithmetic unit obtains a time-series estimated data string relating to predetermined battery data by performing arithmetic corresponding to the data storage period and according to the battery model equation handling the data array of the battery data as recursive inputs. The estimation processing unit estimates the parameter change rate of the diffusion parameter based on a comparison between the estimated data string obtained by the battery model arithmetic unit and the data string of the predetermined battery data stored in the estimation data storing unit.

Further preferably, the estimation data storing unit starts the data storage period according to satisfaction of a predetermined storage start condition, and ends the data storage period according to satisfaction of a predetermined storage end condition. The state estimating device further includes an evaluation function arithmetic range determining unit. The evaluation function arithmetic range determining unit determines an evaluation function arithmetic range representing a time range used for estimating the parameter change rate. The battery model arithmetic unit executes arithmetic according to the battery model equation, for the diffusion parameter, using a value obtained by multiplying a candidate value of the parameter change rate by the initial state parameter value corresponding to the battery state at each point in time to be subjected to the arithmetic. The estimation processing unit includes an evaluation function arithmetic unit and an estimation processing control unit. The evaluation function arithmetic unit calculates an evaluation function corresponding to the evaluation function arithmetic range determined by the evaluation function arithmetic range determining unit, relating to the predetermined battery data, based on an error between a value of the estimated data string obtained by the battery model arithmetic unit and a value of the data string. The estimation processing control unit successively selects a plurality of the candidate values, and estimates the parameter change rate of the diffusion parameter based on a comparison between the evaluation functions calculated with respect to the candidate values, respectively. The diffusion parameter is preferably represented as a function of the battery temperature.

Thereby, the change rate of the diffusion parameter with respect to the initial state can be estimated independently of large changes in diffusion parameter caused by changes in battery state, without using a nonlinear adaptive digital filter or the like for the diffusion parameter (e.g., diffusion constant) including a diffusion speed of the reaction-participating material inside the secondary battery.

Further preferably, the battery model arithmetic unit obtains the time-series estimated data string relating to the battery current by performing arithmetic corresponding to the data storage period and according to the battery model equation using the data array of the battery voltage and the battery temperature as its recursive inputs. The evaluation function arithmetic unit obtains the evaluation function by integrating a square error between a value of the estimated data string and a value of the battery data array relating to the battery current, corresponding to the evaluation function arithmetic range.

Thereby, the candidate values of the parameter change rate can be evaluated based on the errors of the estimated value of the battery current based on the arithmetic according to the battery model equation and the measured value of the battery current.

Further preferably, the estimation data storing unit determines that the storage start condition is satisfied, in response to a relaxation state of the secondary battery.

Thereby, the battery model can be accurately initialized in the estimation of the change rate of the diffusion coefficient so that the change rate of the diffusion coefficient can be accurately estimated using the time-series battery data that is stored thereafter.

Further preferably, the battery model equation includes a voltage equation expressed by an open-circuit voltage being a function of a reaction-participating material concentration at a surface of an active material inside the secondary battery and an overvoltage depending on the current, and a diffusion equation defining a distribution of the reaction-participating material concentration inside the active material.

Thereby, the diffusion equation performing definition according to the physical law can express the dependence of the open-circuit voltage on the reaction-participating material concentration at the surface of the active material and the diffusion process of the reaction-participating material concentration inside the active material so that the internal state of the battery can be precisely estimated.

Further preferably, the estimation data storing unit determines that the storage start condition is satisfied, when such a state continues for a predetermined time or more that an absolute value of the battery current detected by the detecting unit is smaller than a predetermined value, and a maximum concentration difference in a distribution of the reaction-participating material concentration inside the active material estimated by the battery state estimating unit is smaller than a predetermined value.

Thereby, it is possible to determine correctly that the battery is in the relaxation state, based on an internal behavior estimated according to the battery model so that the storage start condition for the battery data for estimating the diffusion coefficient change rate can be appropriately set.

Particularly, the evaluation function arithmetic range determining unit determines, as a start time, a point in time during the data storage period when the secondary battery is in a charged state and a concentration difference of a predetermined value or more in absolute value occurs between the reaction-participating material concentration at the surface of the active material and an average value of the reaction-participating material concentration inside the active material in estimation by the battery state estimating unit determines, as an end time, a point in time during the data storage period when the battery current continuously takes an absolute value smaller than a predetermined value for a predetermined time or more thereafter, and determines a time range from the start time to the end time as the evaluation function arithmetic range when a discharge current of a predetermined value or more has not occurred during the period from the start time to the end time.

Thereby, the evaluation function arithmetic range for estimating the parameter change rate can be appropriately set according to the battery state.

Particularly, in the above structure, the change rate estimating unit inhibits, during the estimation processing for the parameter change rate, the setting of the new data storage period by the estimation data storing unit, and allows the setting of the new data storage period at the end of the data storage period without executing the estimation processing for the parameter change rate when the time range to be determined as the evaluation function arithmetic range is not present within the data storage period.

Thereby, when the time range that can be determined as the evaluation function arithmetic range is not present within the data storage period, the estimation processing for the parameter change rate is not executed so that the degrading of the estimation accuracy can be prevented.

Preferably, the estimation processing control unit executes setting of the plurality of candidate values of the parameter change rate and fixing of the estimated value of the parameter change rate, based on search according to a golden selection method.

Thereby, the change rate of the diffusion coefficient minimizing the evaluation function can be obtained in the golden selection method by performing the searching a known number of times. Thereby, it is possible to grasp in advance an arithmetic time required for estimating the parameter change rate of the diffusion coefficient.

Further preferably, the predetermined parameter further includes a resistance parameter expressing a DC resistance of the secondary battery, and the change rate estimating unit further includes a DC resistance change rate estimating unit successively estimating a parameter change rate of the resistance parameter by using, as its input/output, a state quantity obtained from the battery model equation and from the battery temperature, the battery current and the battery voltage detected by the detecting unit, and by employing a least-square method in a linear regression model equation using the change rate as an estimation parameter.

Thereby, the DC resistance and the diffusion coefficient can be estimated independently of each other so that the estimation of the battery deterioration state can be accurately executed.

Further preferably, the battery state estimating unit executes the estimation of the state quantity of the secondary battery for each of the diffusion parameter and the resistance parameter in the battery model equation, according to the battery model equation, using values obtained by multiplying the parameter change rate successively estimated by the change rate estimating unit and the initial state parameter value corresponding to the present battery state based on the data read from the storing unit.

Thereby, the change rate of the DC resistance and the change rate of the diffusion coefficient contributing the changes in diffusion resistance can be reflected in the battery model so that it is possible to prevent the degrading of the estimation accuracy according to the battery model due to battery deterioration, variations in product or the like.

Further preferably, the battery model arithmetic unit executes the arithmetic according to the battery model equation using, for the resistance parameter in the battery model equation, the fixed parameter change rate and the initial state parameter value corresponding to the battery state at each point in time to be subjected to the arithmetic. Alternatively, the battery model arithmetic unit executes the arithmetic according to the battery model equation using, for the resistance parameter in the battery model equation, a value obtained by multiplying the average value of the parameter change rate successively estimated by the DC resistance change rate estimating unit during the data storage period by the initial state parameter value corresponding to the battery state at each point in time to be subjected to the arithmetic.

Thereby, it is possible to prevent such a situation that the change rate of the diffusion parameter is estimated under the state where large changes occur in DC resistance and thereby the changes in DC resistance is erroneously estimated as the changes in diffusion coefficient. Thereby, both the DC resistance change rate and the diffusion coefficient change rate can be estimated accurately.

Further preferably, the change rate estimating unit inhibits the use of the battery data array during the data storage period for estimating the parameter change rate of the diffusion parameter when a change of a predetermined value or more occurs in the parameter change rate estimated by the DC resistance change rate estimating unit or in the SOC of the secondary battery.

Thereby, it is possible to prevent occurrence of the estimation error that may be caused by interference between the estimation result of the DC resistance change rate and the estimation result of the diffusion parameter (diffusion coefficient), and the change rates of both the DC resistance and the diffusion coefficient can be estimated accurately.

As described above, the prevent invention achieves the following advantages. It is possible to prevent, for the parameter identification in the battery model equation, the degrading of the estimation accuracy due to the changes in parameter value corresponding to the changes in battery state, and to ensure the estimation accuracy of the battery model corresponding to the secular change in battery. Also, the degree of battery deterioration can be accurately estimated, using the changes rates of the DC resistance and the diffusion coefficient that are estimated.

BEST MODES FOR CARRYING OUT THE INVENTION

Embodiments of the invention will now be described with reference to the drawings. In the figures, the same or corresponding portions bear the same reference numbers, and description thereof is not repeated.

(Whole Structure)

Figure 1:
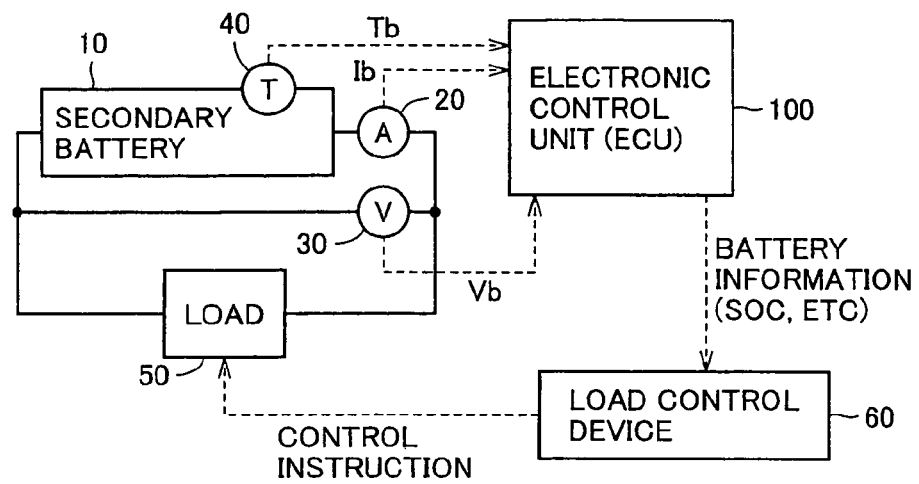
FIG. 1 is a block diagram showing a schematic structure of a power supply system employing a state estimating device of a secondary battery of an embodiment of the invention.

FIG. 1 is a block diagram showing a schematic structure of a power supply system that employs a state estimating device of a secondary battery according to an embodiment of the invention and uses the secondary battery as a power supply.

Referring to FIG. 1, a secondary battery 10 supplies a drive power to a load 50. Load 50 is formed of, e.g., an electric motor mounted on an electric vehicle, a hybrid vehicle or the like for driving it. Further, load 50 charges secondary battery 10 by a regenerative power of the electric motor. Secondary battery 10 is typically formed of a lithium-ion battery.

Secondary battery 10 is provided with a current sensor 20 for measuring a battery current, a voltage sensor 30 for measuring a battery voltage and a temperature sensor 40 for measuring a battery temperature. In the following description, values measured by current sensor 20, voltage sensor 30 and temperature sensor 40 are expressed as a "battery current Ib", "battery voltage Vb" and "battery temperature Tb", respectively.

Battery current Ib, battery voltage Vb and battery temperature Tb measured by respective sensors 20, 30 and 40 are provided to an Electronic Control Unit (ECU) 100. It is defined that battery current Ib is represented by a positive value (Ib>0) in a discharge operation of secondary battery 10, and is represented by a negative value (Ib<0) in a charge operation.

ECU 100 corresponding to the state estimating device of the secondary battery according to the embodiment of the invention includes a microprocessor, a memory, an A/D converter and the like which are not shown, and is configured to execute a predetermined program prestored in the memory. Thereby, ECU 100 executes predetermined arithmetic processing using input signals and data provided from sensors and the like, and thereby produces an output signal and data based on a result of the arithmetic result. In this embodiment, ECU 100 dynamically estimates an internal state of secondary battery 10 according to a battery model to be described later based on battery data which is detected by current, voltage and temperature sensors 20, 30 and 40 (i.e., the battery data collectively representing Ib, Vb and Tb). Thereby, ECU 100 produces battery information such as an SOC.

Particularly, ECU 100 can estimates parameters in a battery model equation according to the battery model equation based on the battery data during driving of load 50 by secondary battery 10, i.e., during an actual load driving performed when load 50 is driven by a power supplied from secondary battery 10 or when secondary battery 10 is charged with a regenerative power provided from load 50.

Therefore, when it is configured to obtain a deterioration state (a degree of deterioration) of secondary battery 10 based on this parameter estimation result, the degree of battery deterioration can be estimated based on the battery data during on-line that actually drives load 50. Thus, the degree of battery deterioration can be estimated without stopping the drive of load 50, charging/discharging secondary battery 10 with a special charge/discharge pattern or isolating secondary battery 10 from load 50. By successively reflecting the parameter estimation results in the battery model, the accuracy of the estimation with the battery model can be ensured according to the secular change in parameter value.

ECU 100 provides the battery information thus obtained to a load control device 60, Load control device 60 generates a control instruction for controlling a drive state of load 50 based on the battery information. For example, when the SOC of secondary battery 10 lowers to or below a predetermined value, load control device 60 produces the control instruction to restrict the power used by load 50, Conversely, when the SOC of secondary battery 10 is higher than the predetermined value, load control device 60 produces the control instruction to suppress generation of the regenerative power from load 50.

(Description of Battery Model Equation)

Description will now be given on an example of the battery model used for the state estimation for secondary battery 10. The battery model to be described below is configured to include a nonlinear model so that internal behaviors can be dynamically estimated in view of an electrochemical reaction inside the secondary battery.

Figure 2:
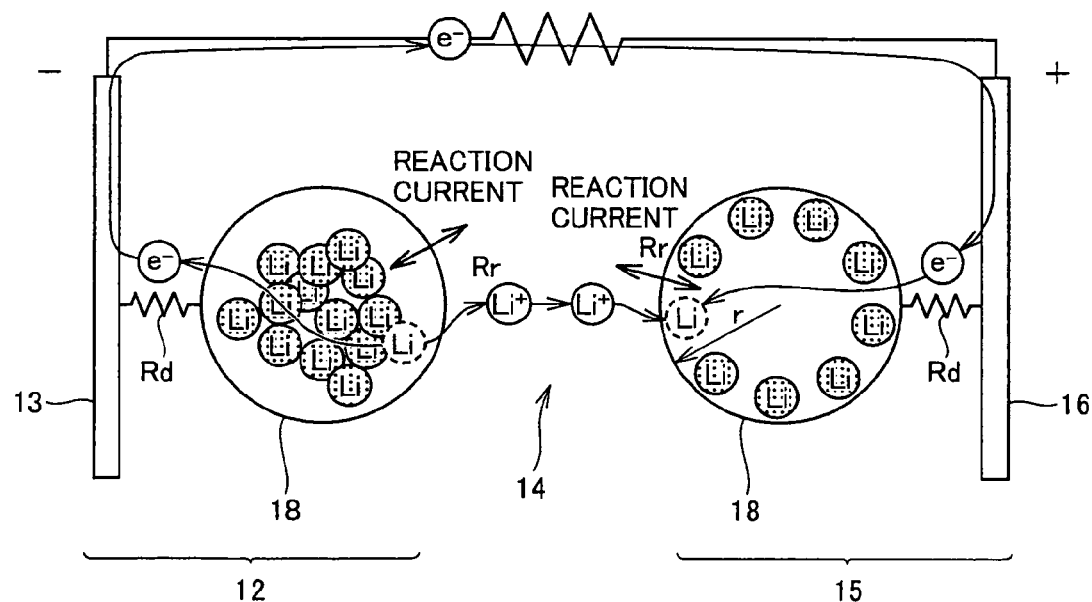
FIG. 2 is a conceptual diagram schematically illustrating an internal structure of the secondary battery represented by a battery model.

FIG. 2 is a conceptual diagram schematically illustrating an internal structure of secondary battery 10 expressed by a battery model.

Referring to FIG. 2, secondary battery 10 includes a negative electrode 12, a separator 14 and a positive electrode 15. Separator 14 is formed by impregnating resin arranged between negative electrode 12 and positive electrode 15 with an electrolyte.

Each of negative electrode 12 and positive electrode 15 is formed of an aggregate of spherical active materials 18. On an interface of active material 18 of negative electrode 12, a chemical reaction of discharging lithium ions $Li^+$ and electrons $e^-$ occurs. On an interface of active material 18 of positive electrode 15, a chemical reaction of absorbing lithium ions $Li^+$ and electrons $e^-$ occurs.

Negative electrode 12 is provided with a current collector 13 absorbing electrons $e^-$, and positive electrode 15 is provided with a current collector 16 discharging electrons $e^-$. Current collector 13 of the negative electrode is typically made of copper, and current collector 16 of the positive electrode is typically made of aluminum. Current collector 13 is provide with a negative terminal, and current collector 16 is provided with a positive terminal. By the transmission of lithium ions $Li^+$ via separator 14, secondary battery 10 is charged or discharged to produce a charge current (Ib<0) or a discharge current (Ib>0).

The charge/discharge state inside the secondary battery depends on a lithium concentration distribution in active material 18 of the electrodes (negative electrode 12 and positive electrode 15). The lithium corresponds to the reaction-participating material in the lithium-ion battery.

As will be described below in detail, a combination or sum of purely electrical resistance (pure resistance) Rd with respect to movement of electrons $e^-$ in negative electrode 12 and positive electrode 15 and a charge-transfer resistance (reaction resistance) Rr equivalently acting as an electric resistance when a reaction current occurs at the active material interface corresponds to the DC resistance when secondary battery 10 is macroscopically viewed. This macroscopic DC resistance may also be expressed as a "DC resistance Ra" hereinafter. The diffusion of lithium Li in active material 18 is governed by a diffusion coefficient $D_s$.

An example of the battery model used in ECU 100 will be further described below. In the battery model equation to be described below, consideration is given to the fact that an influence by an electric double layer capacitor is small at a room temperature, and therefore the battery model is configured without considering the above influence. For reducing an arithmetic load, negative electrode 12 and positive electrode 15 are expressed by the same active material model, and modeling of the lithium diffusion in the active material is performed on a single spherical active material model having characteristics obtained by averaging those of negative electrode 12 and positive electrode 15. Further, the battery model is defined as a model per unit plate (i.e., pole plate) area of the electrode so that it may be standardized with respect to a design capacity.

For a battery voltage V, i.e., the output voltage of secondary battery 10, the following equation (1) is satisfied, using a battery temperature T, a battery current I, an Open-Circuit Voltage (OCV) U and a macroscopic DC resistance $R_a$ of whole secondary battery 10 already described. Battery current I indicates a current value per unit plate area. Thus, battery current I is defined by (I=Ib/S) where Ib indicates a battery current flowing through the positive and negative terminals (and taking a value measurable with an ampere meter), and S indicates an area of a double-sided plate (i.e., double-sided pole plate) of the battery. In the following description, the "current" and the "estimated current value"

used in connection with the battery model relate to the current per unit plate area described above unless otherwise specified.

$$V = U(\theta) - R_a(\theta, T) \times I \quad (1)$$

Figure 3:
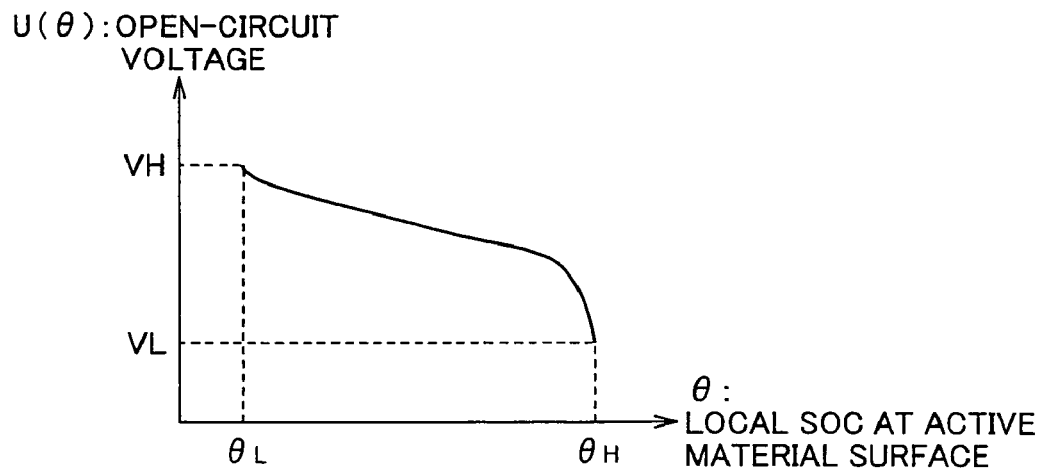
FIG. 3 conceptually shows change characteristics of an open-circuit voltage with respect to changes in local SOC.

Open-circuit voltage U has characteristics of changing depending on S that is a local SOC at the active material surface, as illustrated in FIG. 3. Therefore, by measuring the relationship between local SOC θ and open-circuit voltage U in the initial state of secondary battery 10, it is possible to prepare a characteristic map that prestores the characteristics of changes of open-circuit voltage U(θ) with respect to changes in local SOC(θ) in accordance with the characteristic illustrated in FIG. 3.

Figure 23:
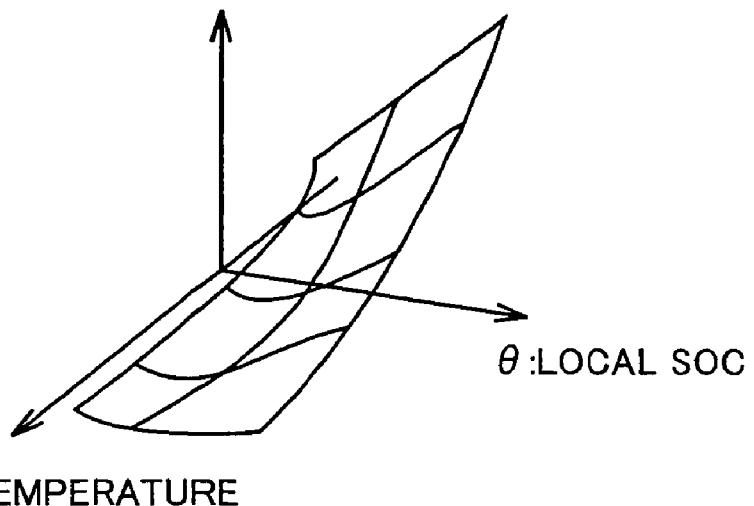
FIG. 23 is a conceptual diagram showing change characteristics of a DC resistance with respect to changes in local SOC and battery temperature.

DC resistance $R_a$ has characteristics of changing with changes in local SOC θ and battery temperature T as illustrated in FIG. 23. More specifically, DC resistance $R_a$ is represented as a function of local SOC θ and battery temperature T. Therefore, based on actually measured experiment results in the initial state of secondary battery 10, it is possible to prepare the characteristic map (DC resistance map) that determines the value of DC resistance Ra corresponding to the combination of local SOC θ and battery temperature T according to the characteristics exemplified in FIG. 23.

In one spherical active material model having the characteristics obtained by averaging those of negative electrode 12 and positive electrode 15 as described above, local SOC θ at the active material surface (interface with the electrolyte) is defined by the following equation (2):

$$\theta = \frac{c_{se}}{c_{s,max}} \quad (2)$$

In the equation (2), $C_{se}$ indicates an average lithium concentration at the active material interface, and $C_{s,max}$ indicates a limit lithium concentration in the active material.

In the active material handled in the spherical model, lithium concentration $C_s$ has a radial distribution. Thus, the lithium concentration distribution in the active material that is assumed to be spherical is defined by the following equation (3) that is a diffusion equation of a polar coordinate system.

$$\frac{\partial c_s}{\partial t} = D_s(T) \cdot \left( \frac{\partial^2 c_s}{\partial r^2} + \frac{2}{r} \cdot \frac{\partial c_s}{\partial r} \right) \quad (3)$$

Figure 4:
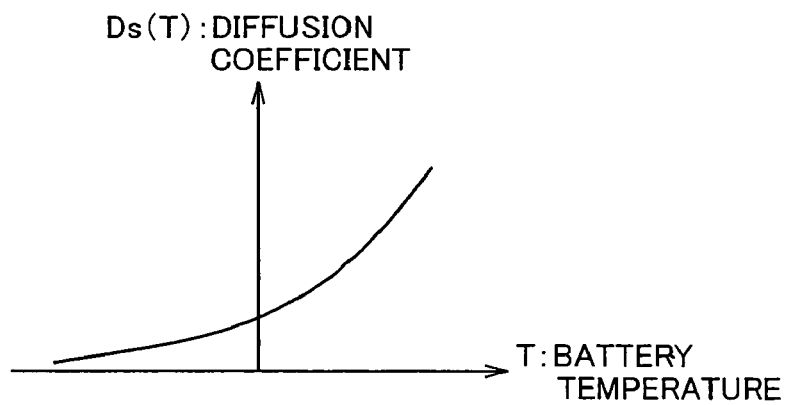
FIG. 4 conceptually shows change characteristics of a diffusion coefficient with respect to changes in battery temperature.

In the equation (3), $D_s$ indicates a diffusion coefficient of the lithium in the active material, and has characteristics of changing depending on the battery temperature as shown in FIG. 4. For diffusion coefficient $D_s$, therefore, the characteristic map (diffusion coefficient map) prestoring the change characteristics of diffusion coefficient $D_s(T)$ in FIG. 4 with respect to the changes in battery temperature can be prepared based on the measurement results in the initial state of secondary battery 10 in accordance with the characteristic shown in FIG. 4, similarly to DC resistance $R_a$.

The boundary conditions of the diffusion equation of the equation (3) are set as expressed by the following equations (4) and (5):

$$\frac{\partial c_s}{\partial r} = 0 \; (r = 0) \quad (4)$$

$$\frac{\partial c_s}{\partial t} = \frac{\partial c_{se}}{\partial t} = -\frac{j^{Li}}{\varepsilon_s a_s F} \; (r = r_s) \quad (5)$$

The equation (4) represents that a concentration gradient at the center of the active material is zero. The equation (5) means that the lithium concentration changes at the interface of the active material to the electrolyte are caused by entry and exit of the lithium through the surface of the active material.

In the equation (5), $r_s$ represents an active material radius, $\varepsilon_s$ indicates a volume fraction of the active material, and $a_s$ represents an active material surface area per unit electrode volume. These values are determined from the results of measurement by various kinds of electrochemical measurement methods. F represents a Faraday constant.

Further, $j^{Li}$ in the equation (5) indicates a lithium production quantity per unit volume and unit time. When it is assumed for the sake of simplicity that the reaction occurs uniformly in the thickness direction of the electrode, $j^{Li}$ is expressed by the following equation (6) using an electrode thickness L and battery current I per unit plate area:

$$j^{Li} = -\frac{I}{L} \quad (6)$$

Using battery current I or battery voltage V as an input, these equations (1)-(6) are solved simultaneously. Thereby, the SOC can be estimated by estimating the internal state of secondary battery 10 while calculating the estimated voltage value or the estimated current value.

By using this battery model, the SOC of the secondary battery can be estimated using battery voltage V as the input. When battery voltage V is used as the input, the SOC is calculated using the map (FIG. 6) representing the relationship between the average lithium concentration in the active material model and the SOC.

First, the description will be given on a method of calculating the estimated SOC value and the estimated current value of the battery, using the battery model described above and using, as inputs, battery voltage Vb and battery temperature Tb measured by the sensors.

Figure 5:
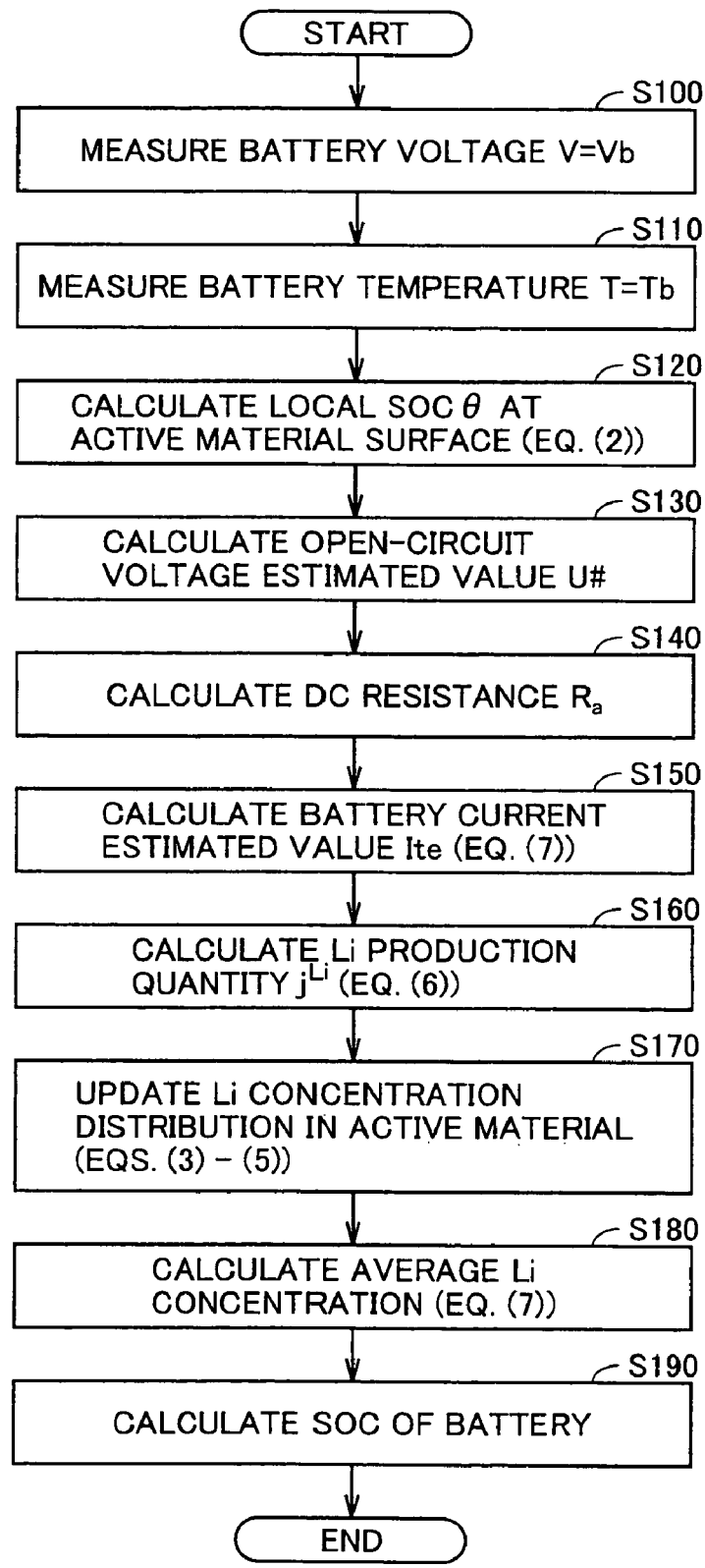
FIG. 5 is a flowchart illustrating a method of estimating an SOC using a battery model equation of the embodiment of the invention.

FIG. 5 shows a flowchart illustrating the method of estimating the SOC using the battery model equation according to the embodiment of the invention. ECU 100 calls and executes the processing illustrated in FIG. 5 in every predetermined arithmetic period.

Referring to FIG. 5, ECU 100 measures battery voltage Vb by voltage sensor 30 in step S100, and uses measured battery voltage Vb as battery voltage V in the battery model equation. Further, the ECU 100 measures battery temperature Tb by temperature sensor 40 in step S110, and uses measured battery temperature Tb as battery temperature T in the model equation.

In step S120, ECU 100 calculates local SOC θ at the active material surface from the equation (2) based on the lithium concentration distribution obtained in the last arithmetic processing. In step S130, ECU 100 calculates an estimated open-circuit voltage value U# from the characteristic map of open-circuit voltage U(θ) with respect to local SOC θ as illustrated in FIG. 3.

Further, in step S140, ECU 100 calculates, from prestored DC resistance map, DC resistance $R_a$ with respect to local SOC θ and battery temperature T. Using measured battery voltage Vb, estimated open-circuit voltage value U# thus calculated and DC resistance $R_a$, ECU 100 calculates an estimated value $I_{te}$ of the battery current according to the following equation (7) in step S150.

$$I_{te} = \frac{U\# - Vb}{R_a} \quad (7)$$

In next step S160, ECU 100 calculates a lithium production quantity $j^{Li}$ per unit volume and unit time by substituting estimated battery current value $I_{te}$ for battery current I in the equation (6). By using lithium production quantity $j^{Li}$ per unit volume and unit time in the boundary conditions of the equation (5), the diffusion equation (3) is solved to determine the lithium concentration distribution in the active material. Diffusion coefficient $D_s$ in the equation (3) can be calculated based on measured battery temperature Tb according to the diffusion coefficient map with respect to the battery temperature illustrated in FIG. 4.

For solving the diffusion equation (3), ECU 100 updates lithium concentration distribution $C_{s,k}(t+\Delta t)$ in the active material using the diffusion equation discretized with position and time in step S170, assuming that $\Delta t$ indicates a discrete time step (corresponding to an arithmetic period), and k indicates numbers of discrete positions discretized in the radial direction. Since the method of discretizing the diffusion equation with position and time is well known, description thereof is not performed.

In next step S180, ECU 100 calculates an average lithium concentration $c_{save}$ in the active material according to the following equation (8):

$$c_{save} = \frac{1}{N} \sum_{k=1}^{N} c_{s,k} \quad (8)$$

In the equation (8), N indicates the number of divided portions formed by radially discretizing the spherical active material.

Figure 6:
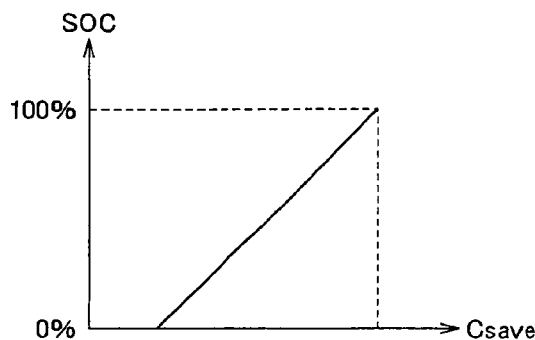
FIG. 6 conceptually shows an structural example of a map illustrating a relationship between an average lithium concentration and the SOC in an active material model.

In step S190, ECU 100 calculates the SOC using the pre-stored map indicating the relationship between average lithium concentration $c_{save}$ in the active material and the SOC of secondary battery 10, as shown in FIG. 6.

As described above, ECU 100 can calculates the SOC of secondary battery 10 and the estimated value of the battery current per unit plate area from battery voltage Vb and battery temperature Tb measured by the sensors. From the above definition equation of battery current I, the estimated value of the whole current flowing through the battery can be calculated by multiplying the estimated current value per unit plate area by a double-sided plate area of the battery.

First Embodiment

Among the parameters in the battery model equation, DC resistance $R_a$ changes according to the battery states such as battery temperature Tb and local SOC $\theta$ already described, and also changes due to secular deterioration caused by use of the battery. Accordingly, an error occurs in the estimated SOC when a difference occurs between the actual DC resistance and DC resistance $R_a$ in the initial state (typically, in the new state) stored in the DC resistance map used in the battery model. The initial state is not restricted to the new state, and may be defined as the state intermediate between the new state and an expected maximally deteriorated state. As will be apparent from the following description, this definition can narrow the range of the estimated change rate value with respect to the initial state parameter value, and therefore can improve the estimation accuracy.

Therefore, the first embodiment will be described below in connection with the following structures. The estimation is performed in connection with DC resistance $R_a$ that is one of the parameters of the battery model already described, and particularly the change rate thereof with respect to the initial state parameter value is estimated. Thereby, the secular change of the DC resistance is estimated, and thereby the degree of deterioration of secondary battery 10 is estimated. Further, by reflecting an estimated DC resistance change rate gr in the battery model, the structure can accurately estimate the state quantity (typically, the SOC) even when the DC resistance increases due to the secular change.

In the first embodiment, the following equation (9) defines change rate gr of the parameter of DC resistance $R_a$ with respect to parameter value $R_{an}$ in the initial state.

$$gr = R_a / R_{an} \quad (9)$$

By estimating DC resistance change rate gr, the secular change in DC resistance due to use of the secondary battery can be estimated independently of the changes in DC resistance due to the change in battery state such as battery temperature Tb and local SOC $\theta$.

Figure 7:
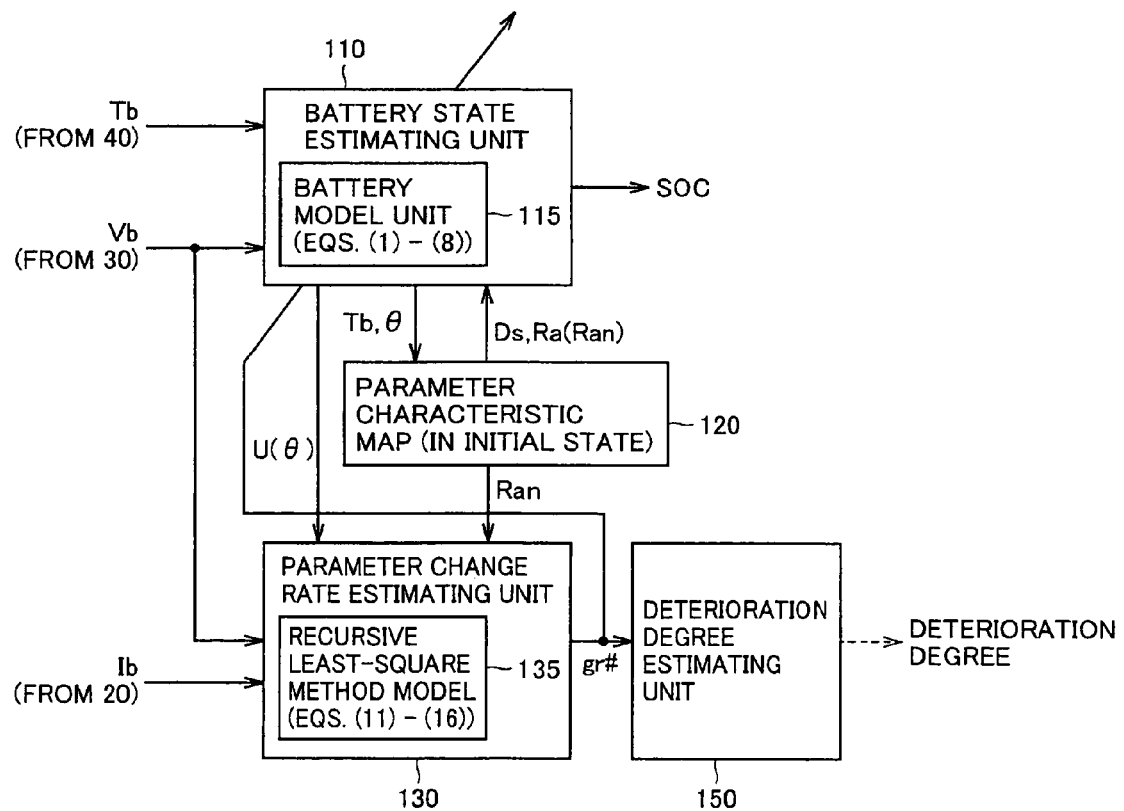
FIG. 7 is a block diagram illustrating a structure for estimation learning of a DC resistance change rate according to a first embodiment.

FIG. 7 is a block diagram illustrating an estimation leaning structure for change rate gr of DC resistance $R_a$ that is a parameter in the battery model equation according to the first embodiment. ECU 100 achieves the processing of estimating the change rate according to the block diagram of FIG. 7.

It is noted that each block shown in each block diagram is a function block corresponding to the function unit achieved by ECU 100. Each block can be configured by circuit (hardware) having the corresponding function. Alternatively, each block can be realized by execution of software process by ECU 100 in accordance with the prescribed program.

Referring to FIG. 7, a battery state estimating unit 110 includes a battery model unit 115 formed according to the foregoing equations (1)-(8). According to the flowchart of FIG. 5, battery state estimating unit 110 estimates the internal state (behaviors) of secondary battery 10 in every arithmetic period, and calculates the SOC based on the result of this estimation.

As already described, a parameter characteristic map 120 has stored the characteristic map that relates to parameter diffusion coefficient D, and DC resistance $R_a$ in the battery model equation and is based on the measurement result in the initial state. Thus, parameter characteristic map 120 allows reading of diffusion coefficient $D_s$ and DC resistance $R_a$ ($R_{an}$) corresponding to the present battery state according to the battery states such as battery temperature Tb and local SOC $\theta$ that change every moment.

A parameter change rate estimating unit 130 uses the recursive least-square method according to equations (11)-(16) to be described later, and calculates an estimated value gr# of DC resistance change rate gr expressed by the equation (9) by performing the parameter identification based on the battery model equation that uses the battery data (Tb, Vb and Ib) measured by sensors 20, 30 and 40 as well as initial state parameter value $R_{an}$ of the DC resistance corresponding to the present battery state (Tb and $\theta$).

After battery state estimating unit 110 performs the estimation arithmetic for obtaining the initial state of secondary battery 10 as well as the SOC calculation processing based on the result of this estimation arithmetic, parameter change rate estimating unit 130 estimates change rate gr of DC resistance $R_a$, using the recursive least-square method with a forgetting component to be described later. First, the recursive least-square method with the forgetting component will be described.

The recursive least-square method uses a system represented by the linear regression model represented by the following equation (10). In this system, a parameter Θ in the equation (10) is estimated by recursively calculating the following time update equations (11)-(13) with the initial conditions of the following equations (14) and (15). In each equation, Θ# represents an estimated value of parameter Θ.

$$Y = Z^T \Theta \qquad (10)$$

$$\Theta\#(k) = \Theta\#(k-1) + \frac{P(k-1)Z(k)}{\lambda + Z^T(k)P(k-1)Z(k)}\varepsilon(k) \qquad (11)$$

$$\varepsilon(k) = Y(k) - Z^T(k)\Theta\#(k-1) \qquad (12)$$

$$P(k) = \frac{1}{\lambda}\left\{P(k-1) - \frac{P(k-1)Z(k)Z^T(k)P(k-1)}{\lambda + Z^T(k)P(k-1)Z(k)}\right\} \qquad (13)$$

$$\Theta\#(0) = \Theta\#_0 \qquad (14)$$

$$P(0) = \gamma I \qquad (15)$$

In the equations (11) and (13), λ is a forgetting coefficient, and is usually smaller than 1.0. P is a covariance matrix. In the equation (15), an initial value P(0) is a matrix obtained by multiplying diagonal elements of a unit matrix I by a constant γ, and γ usually takes a large value between about $10^2$ and about $10^3$. An initial value $\Theta\#_0$ of parameter Θ# is usually a zero vector.

Using the recursive least-square method with the forgetting component described above, change rate gr of the DC resistance is estimated as follows.

DC resistance $R_a$ of the secondary battery that has changed from the new state due to secular change or deterioration can be expresses as ($R_a = gr \cdot R_{an}$) according to the definition of the equation (9), and this is substituted into the equation (1). Further, it is rewritten into the form of the equation (10) so that the following equation (16) is obtained as the linear regression model equation based on the battery model equation.

$$\underbrace{\frac{U(\theta) - V}{Y}} = \underbrace{R_{an}(\theta, T)}_{Z} \cdot \underbrace{I \times gr}_{\Theta} \qquad (16)$$

In the equation (16), Y can be calculated by using the value estimated in the process of estimating the SOC in the present case as open-circuit voltage U(θ) on the left side and using measured battery voltage Vb as V. In the right side, reference is made to parameter characteristic map 120 using, as factors, battery temperature Tb and local SOC θ obtained by battery state estimating unit 110 in the present arithmetic period, and thereby parameter value $R_{an}$ in the initial state of the DC resistance is obtained. Z can be calculated by substituting the current value per unit plate area calculated from present value Ib measured by current sensor 20 into battery current I.

Using Y and Z thus calculated, the recursive least-square method with the forgetting component described in the equations (11)-(15) can be executed to estimate recursively change rate gr of DC resistance $R_{an}$. Thus, in the first embodiment, the linear regression model equation based on the battery model equation is defined, and the change rate of DC resistance $R_a$ has been described as a typical example of the parameter to which the least-square method can be applied. In the following description, the estimation by the recursive least-square method is described by way of example. However, description will also be given, for confirmation, to another type of least-square method such as a batch least-equation method can be applied.

A deterioration degree estimating unit 150 determines the degree of deterioration of secondary battery 10 according to DC resistance change rate gr# estimated by parameter change rate estimating unit 130. Estimated value gr# of DC resistance change rate represents the rate of change of DC resistance $R_a$ due to the secular change, and thus represents the degree of charge deterioration itself. For example, when estimated value gr# of the DC resistance change rate is equal to 1.2, this represents that DC resistance $R_a$ has increased about 20% from that in the initial state (e.g., the new state). This offers an advantage that the deterioration degree of secondary battery 10 can be estimated directly and easily according to estimated value gr# without using a further map or the like.

DC resistance $R_a$ depends on the battery temperature and the local SOC at the surface of the active material, and varies widely for changes in battery temperature. Therefore, for directly estimating DC resistance $R_a$, a sufficiently speed of following up the temperature changes would be required. The increase in parameter follow-up speed for the estimation tends to increase the parameter variations due to noises, disturbance and the like, resulting in a problem that the parameter cannot be estimated stable.

However, according to the method of the first embodiment, it is merely required to estimate successively only the change rate of DC resistance $R_a$ with respect to parameter value $R_{an}$ in the initial state. In general, the speed of change in parameter value due to the secular change from the initial state is very low as compared with the changes in parameter value due to the change in battery state (because the time constant is large). Therefore, it is not necessary to increase the follow-up speed in the estimation. Accordingly, the above problem can be overcome.

By using the recursive least-square method with the forgetting coefficient (λ<1.0), the present battery data is assigned a weight larger than that assigned to the battery data measured in the past when the estimation is executed. Therefore, even when the DC resistance change rate changes depending on the battery temperature, the SOC and the like due to secular change, it is possible to follow this change in DC resistance change rate and thereby to estimate accurately the DC resistance change rate according to each battery state.

Figure 8:
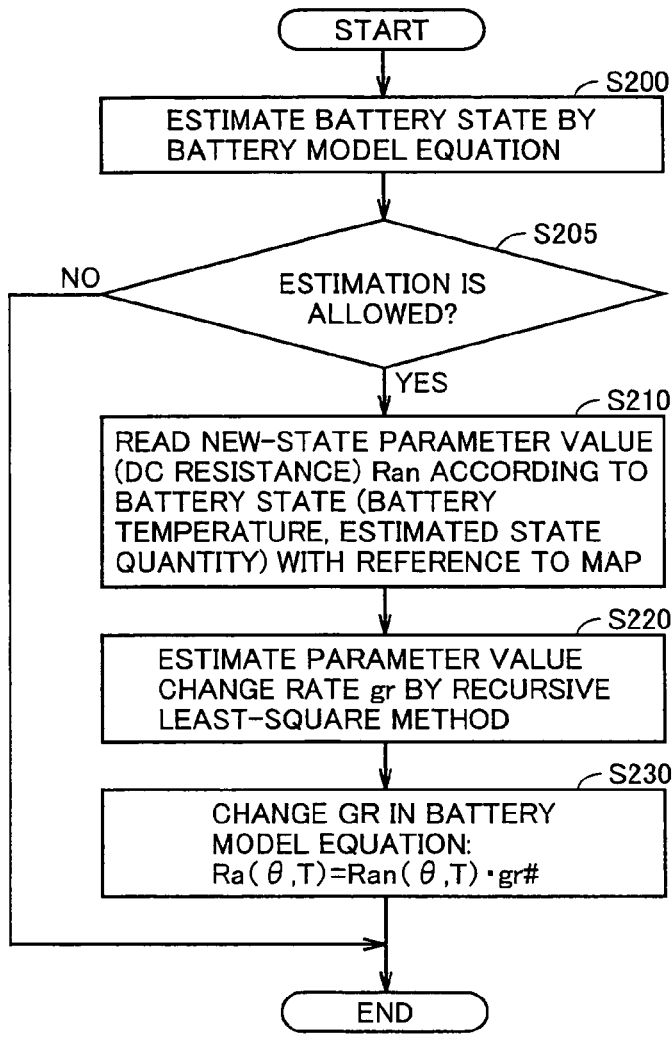
FIG. 8 is a flowchart illustrating processing of estimating the DC resistance change rate according to the first embodiment.

FIG. 8 is a flowchart illustrating processing of estimating DC resistance change rate gr according to the first embodiment.

Referring to FIG. 8, parameter change rate estimating unit 130 executes the estimation (FIG. 5) of the battery state according to the foregoing battery model equations (1)-(8) in step S200. In step S205, ECU 100 determines whether conditions allowing the execution of the DC resistance change rate estimation are satisfied or not. When the conditions allowing the estimation execution are not satisfied (NO in step S205), the processing ends without executing the subsequent estimation of the DC resistance change rate.

In general, when the resistance components of the secondary battery increase due to the battery deterioration, the lithium diffusion speed in the active material lowers (and thus the diffusion coefficient governing the lithium diffusion in the active material lowers from the value in the new state) so that a so-called diffusion resistance also increases. Therefore, in the processing of estimating the change rate of the DC resistance, a consideration must be given to prevent such an error that the increase in diffusion resistance is also identified as the increase in DC resistance change rate.

Accordingly, ECU 100 determines in step S205 whether predetermined conditions allowing execution of the estimation of the DC resistance change rate are satisfied or not.

For example, in step S205, the execution of the processing of estimating the DC resistance change rate is allowed (YES in S205) only when the absolute value of battery current (measured value) Ib falls within a predetermined range. A lower limit of this predetermined current range is set to exclude the relaxation state of the secondary battery, and an upper limit is set to exclude the state of large current discharge.

As described above, by setting the conditions of allowing the estimation execution, the processing can be configured not to estimate the DC resistance change rate in the large current discharge state and the battery relaxation state, i.e., in the states where the diffusion exerts a large influence. Therefore, it is possible to prevent erroneous estimation of the DC resistance change rate due to the influence of diffusion.

Instead of measured battery current Ib, the conditions of allowing the estimation execution in step S205 can be set based on the lithium concentration estimated by the battery model equation.

For example, the following configuration may be employed. When the absolute value of the difference between the lithium concentration at the active material surface and the average lithium concentration in the active material is larger than a predetermined value, or before a predetermined time elapses after the absolute value of the difference between the lithium concentration at the active material surface and the average lithium concentration in the active material became smaller than the predetermined value, the result of determination in step S205 is NO, and the processing of estimating the DC resistance change rate is not allowed. Thereby, it is possible to detect more reliably the situation in which the lithium diffusion in the active material has caused the changes in voltage, and to avoid erroneous estimation of the DC resistance change rate in the situation where the above voltage changes have occurred. The method may be configured to execute both the condition allowing the estimation execution based on battery current Ib described above and the condition allowing the estimation execution based on the lithium concentration.

When the above execution-allowing conditions are satisfied (YES in S205), ECU 100 reads initial state parameter value $R_{an}$ of the DC resistance according to the present battery state (battery temperature Tb and local SOC θ estimated in step S200) with reference to parameter characteristic map 120 in step S210.

In step S220, ECU 100 calculates the change rate estimated value gr# in connection with DC resistance $R_a$, which is one of the parameters of the battery model equation, according to the foregoing recursive least-square method (equations (11)-(16)).

In step S230, ECU 100 changes DC resistance change rate gr in the battery model equation, using estimated value gr# of the DC resistance change rate obtained in step S220. Thus, DC resistance change rate gr in equation (17) is changed, and $R_a(\theta, t)$ is represented by a product of initial state parameter value $R_{an}(\theta, T)$ and estimated value gr# of the DC resistance change rate.

Referring to FIG. 7 again, DC resistance change rate gr# estimated by parameter change rate estimating unit 130 is reflected in the battery model equation, and thereby the estimation accuracy according to the battery model can be improved by reflecting the secular change of DC resistance $R_a$. More specifically, the following equation (17) may be applied to the battery model instead of the equation (1).

$$V=U(\theta)-gr\#\cdot R_{an}(\theta,T)\times I \quad (17)$$

By reflecting the estimation result (gr#) of DC resistance change rate gr in the battery model equation as described above, it is possible to suppress the parameter value error due to the secular change in DC resistance value (parameter value), and thereby to increase the estimation accuracy of the battery state according to the battery model equation.

In the above example, the estimated DC resistance change rate is directly reflected in the battery model equation. However, a result obtained by smoothing the DC resistance change rate with a predetermined time constant may be reflected in the battery model equation. Thereby, it is possible to remove variations in DC resistance change rate due to disturbance and the like.

Figure 9:
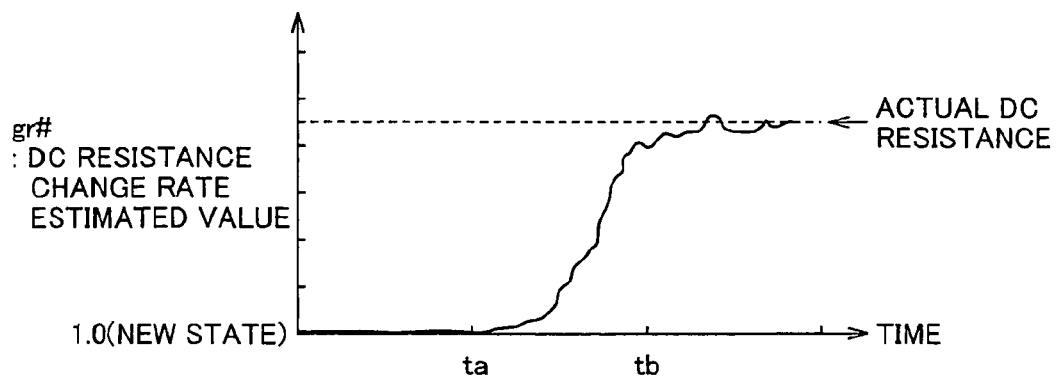
FIG. 9 is a first diagram showing an example of an experiment result of the estimation of the DC resistance change rate according to the first embodiment.
Figure 10:
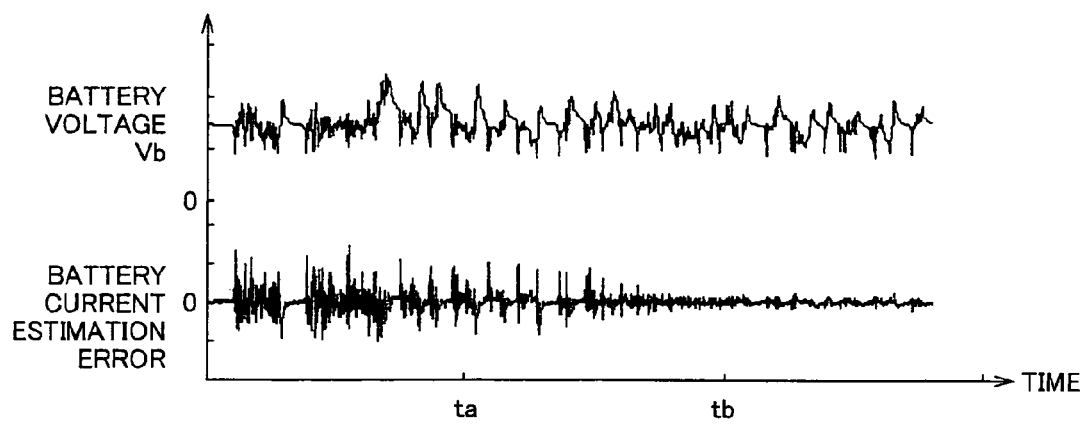
FIG. 10 is a second diagram showing the example of the experiment result of the estimation of the DC resistance change rate according to the first embodiment.
Figure 11:
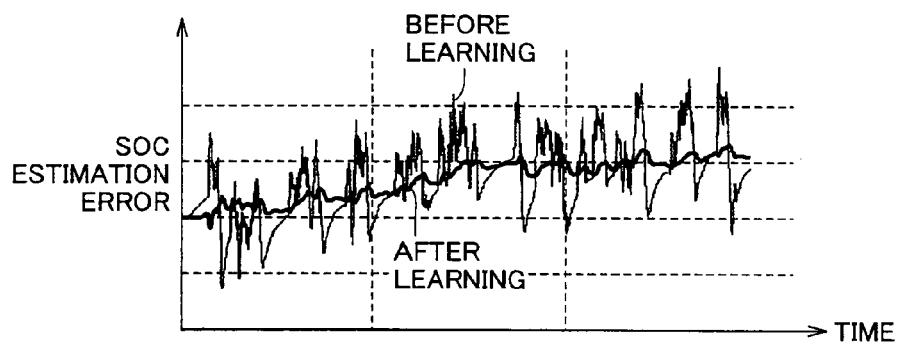
FIG. 11 is a third diagram showing the example of the experiment result of the estimation of the DC resistance change rate according to the first embodiment.

FIGS. 9-11 show results of experiments for estimating the DC resistance estimating rate according to the first embodiment.

FIG. 9 shows an example of changes in estimated value gr# of the DC resistance change rate in the case where DC resistance change rate gr is estimated by charging and discharging a secondary battery having a DC resistance increased due to secular deterioration with a load under a certain temperature condition and an initial SO condition.

It can be seen from FIG. 9 that when the estimation of the DC resistance change rate is successively proceeded online with an initial DC resistance change rate gr equal to 1.0, estimated value gr# of the DC resistance change rate converges toward a value of the change rate (dotted line in FIG. 9) corresponding to the actual DC resistance of the secondary battery.

FIG. 10 shows changes of an estimation error of the battery current with time. The current estimation error is obtained by plotting the error between actually measured battery current Ib and an estimated battery current $I_{te}$ obtained by reflecting estimated value gr# of the DC resistance change rate in the battery model equation at appropriate times according to the above equation (17) and reflecting estimated value gr# of the DC resistance change rate in DC resistance $R_a$ in the equation (7).

It can be seen from FIG. 10 that the current estimation error decreases as estimated value gr# of the DC resistance change rate converges toward the value corresponding to the actual DC resistance as shown in FIG. 9 (from time to to time tb).

FIG. 11 shows transition of the SOC estimation error in the case where the charge and discharge are performed according to the same charge/discharge pattern before and after the DC resistance change rate is estimated and learned. As can be seen from FIG. 11, the variations in change rate estimation error becomes small after the learning of the DC resistance change rate according to the equation (17).

According to the state estimating device of the secondary battery according to the first embodiment of the invention, as described above, DC resistance $R_a$ in the battery model equation is represented by the product of rate gr of change from the initial state parameter value and initial state parameter value $R_{an}$ represented as the function of the battery states such as the battery temperature and the local SOC, and the DC resistance change rate gr is successively estimated online according to measured battery data Tb, Vb and Ib.

Thereby, the parameter in the battery model equation, and particularly the parameter (DC resistance) that changes depending on the changes in battery state can be isolated from the changes in parameter value corresponding to the changes in the battery state, and the secular changes in parameter value can be stably estimated. Based on DC resistance change rate gr that directly indicates this secular change, the degree of deterioration of the secondary battery can be easily estimated.

Also the embodiment employs the learning structure that corrects DC resistance $R_a$ in the battery model equation at appropriate times, using estimated value gr# of the DC resistance change rate, and this structure can increase the estimation accuracy for the internal state of the secondary battery even when the secular deterioration of the battery progresses, and thereby can increase the accuracy of the SOC estimation.

Modification of the First Embodiment

In the first embodiment, the battery behaviors are calculated according to the equation (1) using macroscopic DC resistance $R_a$ of whole secondary battery 10 handling the charge-transfer resistance and the pure resistance in an integrated fashion. However, the charge-transfer resistance and the pure resistance may be handled independently of each other in the model. In addition to the reaction current in the active material, a current caused by the electric double layer capacitor component provided by the battery structure is present in the secondary battery. In view of this, therefore, the voltage equation (1) in the battery model equation can be represented as the following equation (1'):

$$V = U(\theta) - R_r(\theta, T) \times I_{EC} - R_d(T) \times I \quad (1')$$

In the equation (1'), $R_r$ is a charge-transfer resistance, and is represented by a function of battery temperature T and local SOC $\theta$ at the active material surface. $R_d$ is a pure resistance, and is represented by a function of battery temperature T.

$I_{EC}$ indicates a current of the electrochemical component flowing through the active material, and is represented by the following equation (18). I in the equation (1') is a total current that is a sum of the current of the electrochemical component and the current flowing through the electric double layer capacitor. As described above, this current I is defined as the current per unit plate area.

$$I_{EC} = I - C \cdot \frac{d\psi}{dt} \quad (18)$$

In the equation (18), C is a capacitance of an electric double layer capacitor, and $\psi$ in the equation (18) is represented by the following equation (19).

$$\psi = U(\theta) - R_r(\theta, T) \times I_{EC} \quad (19)$$

The equation (18) is discretized with $\Psi$ in the last arithmetic period and $\Psi$ in the present arithmetic period, and the equations (1'), (18) and (19) are compounded so that total current I and current $I_{EC}$ of the electrochemical component can be calculated from measured battery voltage Vb and battery temperature Tb.

A lithium production quantity $j^{Li}$ per unit volume and unit time can be calculated by substituting the following equation (6') for the equation (6) in the battery model equation. This is performed in view of the fact that the current contributing to the reaction is only current $I_{EC}$ in the equation (1').

$$j^{Li} = -\frac{I_{EC}}{L} \quad (6')$$

The diffusion equations of the above equations (3)-(5) is solved using lithium production quantity $j^{Li}$ per unit volume and unit time in the equation (6'), and thereby the lithium concentration distribution in the active material can be calculated similarly to the first embodiment. The average lithium concentration in the active material is likewise obtained according to the equation (8), and thereby the SOC an be estimated similarly to the first embodiment.

In the modification of the first embodiment, when it is assumed that gr1 and gr2 represent the change rates of charge-transfer resistance $R_r$ and pure resistance $R_d$, respectively, charge-transfer resistance $R_r$ after the secular change is represented by ($R_r = R_m \cdot gr1$), i.e., a product of parameter value $R_m$ in the initial state of $R_r$ and change rate gr1. Likewise, pure resistance $R_d$ is represented by ($R_d = R_{dn} \cdot gr2$).

For initial state parameter value $R_m$ of the charge-transfer resistance, the measured values in the initial state are mapped with respect to changes in battery temperature and local SOC, similarly to DC resistance $R_a$ in the first embodiment, and thereby initial state parameter value $R_m$ can be obtained corresponding to the battery state (the battery temperature and the local SOC) at the present time even after occurrence of the secular change. For initial state parameter value $R_{dn}$ of the pure resistance, mapping can be performed based on the measured value in the initial state with respect to the changes in battery temperature.

When change rates gr1 and gr2 are defined as described above, the equation (1') can be changed into an equation (16') for estimating change rates gr1 and gr2 by the recursive least-square method similarly to the first embodiment.

$$\underbrace{\frac{U(\theta) - V}{Y}}_{Y} = \underbrace{[R_m(\theta, T) \cdot I_{EC} + R_{dn}(T) \cdot I]}_{Z} \cdot \underbrace{\begin{bmatrix} gr1 \\ gr2 \end{bmatrix}}_{\Theta} \quad (16')$$

By applying this equation (16') to the recursive least-square method represented by the equations (11)-(15) similarly to the equation (16) in the first embodiment, respective change rates gr1 and gr2 of charge-transfer resistance $R_r$ and pure resistance $R_d$ can be estimated online similarly to change rate gr of macroscopic DC resistance $R_a$ in the first embodiment.

As described above, the DC resistance is divided into the charge-transfer resistance and the pure resistance, and the parameter estimation (change rate estimation) of the DC resistance is executed independently of that of the charge-transfer resistance. Thereby, it is possible to determine which of the charge-transfer resistance (resistance caused by the reaction) and the pure resistance (contact resistance of the collector plate and the electrode) has increased when the DC resistance component of the battery has increased due to the secular deterioration. Consequently, the deterioration mode of the battery can be determined. Therefore, the deterioration determination of the secondary battery can be performed to a higher extent. Also, the estimation accuracy with respect to the secular change of the DC resistance is improved so that the estimation accuracy of the battery model can be improved.

Second Embodiment

When the battery deteriorates, the DC resistances such as the charge-transfer resistance and the pure resistance increase, and further the diffusion speed of the reaction-participating material in the active material lowers (i.e., the diffusion coefficient lowers) so that the so-called diffusion resistance increases. The increase in diffusion resistance significantly affects the battery performance and the current-voltage characteristics particularly in the case where the Charge and discharge continue with large currents. In the hybrid vehicle and electric vehicle that perform the charge and discharge with large currents, therefore, it is an important matter to estimate the changes in diffusion resistance, i.e., changes in diffusion coefficient of the active material.

The second embodiment will be described below in connection with lithium diffusion coefficient $D_s$ in the active material, which is one of the parameters of the foregoing battery model, and particularly to the structure estimating the change rate thereof with respect to the parameter value in the initial state (e.g., the new state).

Figure 12:
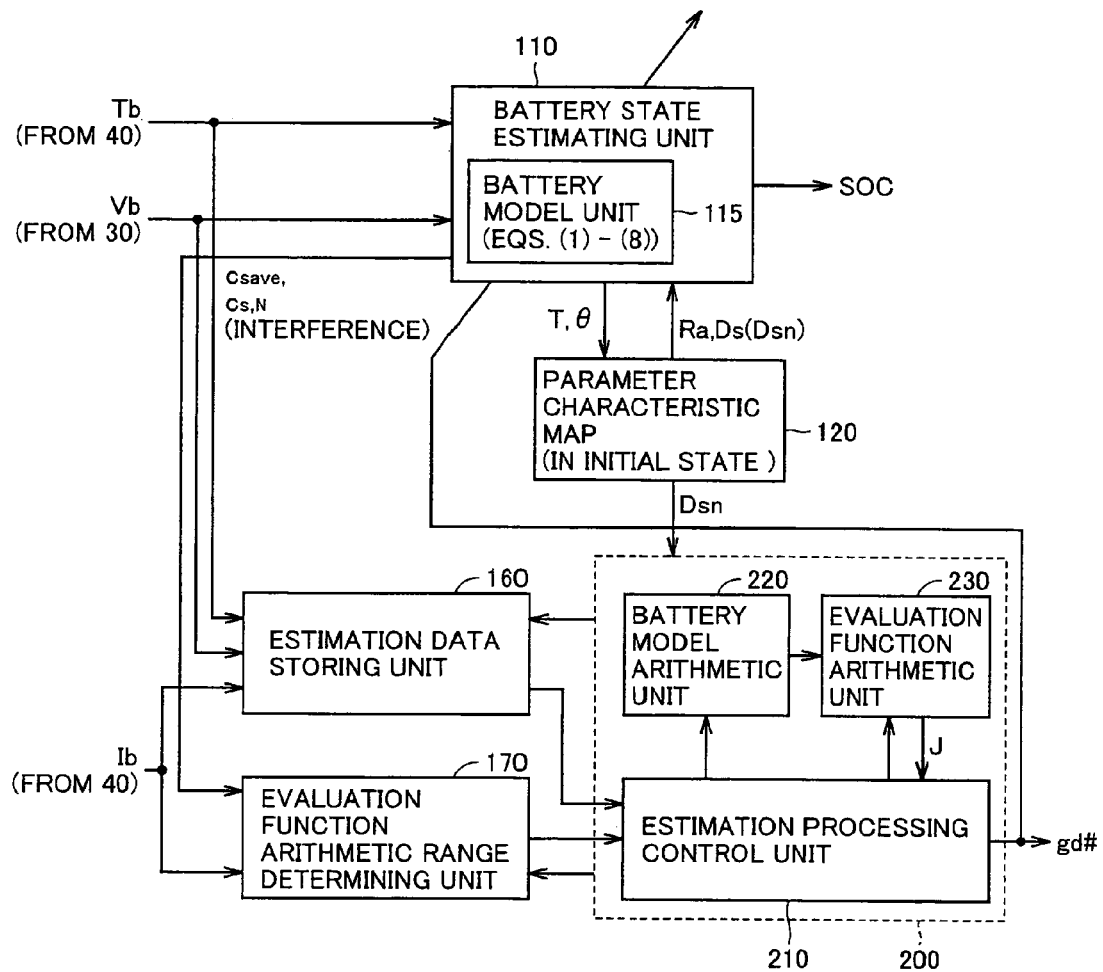
FIG. 12 is a block diagram illustrating a structure for estimation learning of the diffusion coefficient according to a second embodiment.

FIG. 12 is a block diagram illustrating the estimation learning structure for the diffusion coefficient according to the second embodiment. ECU 100 executes the change rate estimation processing in the block diagram of FIG. 12.

Referring to FIG. 12, a state estimating device of the secondary battery according to the second embodiment differs from that in FIG. 7 in that parameter change rate estimating unit 130 is replaced with an estimation data storing unit 160 (i.e., a unit of storing data to be used for estimation), an evaluation function arithmetic range determining unit 170 and a parameter change rate estimating unit 200.

Parameter characteristic map 120 has substantially the same structure as that of the first embodiment, and is configured to allow reading of the initial state parameter values of DC resistance $R_a$ and diffusion coefficient $D_s$ according to the battery state, i.e., the battery temperature and the local SOC. Thereby, it is possible to read the parameter values corresponding to the battery state that changes every moment, and particularly to read the parameter value corresponding to the initial state and corresponding to the battery state at the present time. In the second embodiment, $D_{sn}$ indicates the initial state parameter value of diffusion coefficient $D_s$.

Diffusion coefficient $D_a$ cannot form the linear model equation represented, e.g., in the equations (1) and (16), in contrast to DC resistance $R_a$ that is a target of the estimation in the first embodiment. This is because it is the parameter value in the diffusion equation represented by the equation (3). Thus, in the second embodiment, the change rate estimation of diffusion coefficient $D_s$ will be described as a typical example of the parameter to which the least-square method in the first embodiment or the like cannot be applied.

For diffusion coefficient $D_s$, a diffusion coefficient change rate gd is defined as the change rate with respect to the initial state parameter value.

$$gd=D_s/D_{sn} \quad (20)$$

Estimation data storing unit 160 starts the data storage period in response to the satisfaction of predetermined data storage start condition, and will store battery data Tb, Vb and Ib successively measured by sensors 20-40 as a time-series data array during the data storage period. Also, estimation data storing unit 160 ends the data storage period in response to satisfaction of predetermined data storage end condition. In the data storage period, battery temperature Tb, battery current Ib and battery voltage Vb are stored in a correlated fashion at each time point.

Evaluation function arithmetic range determining unit 170 determines whether the data storage period during which estimation data storing unit 160 stores the battery data includes a time range in which the diffusion resistance significantly affects the battery voltage. When the above range is included, the evaluation function is arithmetically operated using the battery data in the above range, and thereby the evaluation function arithmetic range is determined to estimate the diffusion coefficient change rate.

Figure 13:
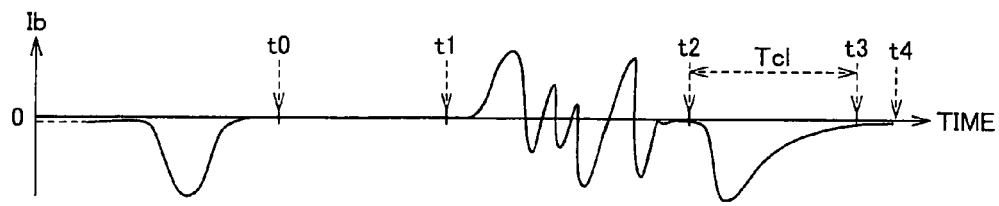
FIG. 13 conceptually illustrates a data storage period and an evaluation function arithmetic range.

As illustrated schematically in FIG. 13, estimation data storing unit 160 starts the data storage period at a time earlier by a certain time than a time t1 when the current starts to flow after the battery relaxation state ends at a time t0. Evaluation function arithmetic range determining unit 170 successively determines whether the foregoing evaluation function arithmetic range is present in the data storage period or not, and determines, e.g., a range between times t2 and t3 as an evaluation function arithmetic range Tlc. When a certain time has elapsed from the start of the data storage period at time t4, the data storage period ends, and parameter change rate estimating unit 200 starts the processing of estimating the diffusion coefficient change rate.

Parameter change rate estimating unit 200 includes an estimation processing control unit 210, a battery model arithmetic unit 220 and an evaluation function arithmetic unit 230. Battery model arithmetic unit 220 sets diffusion coefficient $D_s$ using a candidate value of the diffusion coefficient change rate set by estimation processing control unit 210, performs the arithmetic according to the battery model equation using the data array of battery temperature Tb and battery voltage Vb in the data storage period and thereby calculates the estimated value of battery current Ib per unit plate area corresponding to this data storage period.

Evaluation function arithmetic unit 230 calculates an evaluation function J based on the difference between the battery current (measured value) per unit plate area obtained by dividing battery current (measured value) Ib in the data array by a double-sided plate area with respect to the estimated value of the battery current per unit plate area obtained by battery model arithmetic unit 220 at each time point within the period that corresponds to the evaluation function arithmetic period determined by the evaluation function arithmetic range determining unit 170.

Estimation processing control unit 210 selectively determines the plurality of candidate values of the diffusion resistance change rate, and calculates an estimated value gd# of the diffusion resistance change rate based on the comparison of evaluation function J with respect to the respective candidate values. Estimated value gd# of the diffusion resistance change rate thus calculated is reflected in the battery model equation and is used for setting $D_s$, similarly to DC resistance change rate gr# in the first embodiment.

The processing of estimating the diffusion resistance change rate will now be described in detail.

Figure 14:
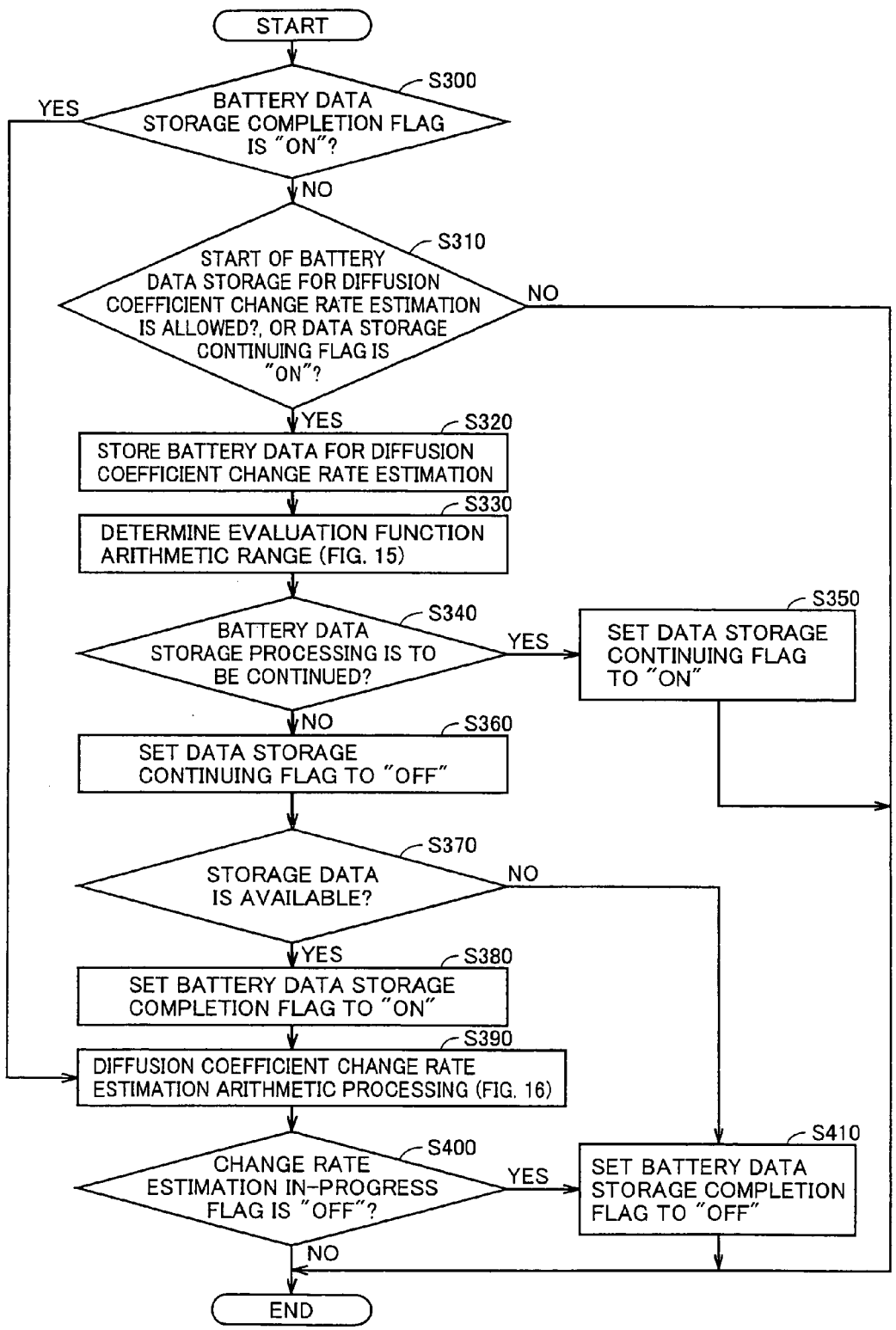
FIG. 14 is a flowchart insulating whole processing of estimating a diffusion coefficient change rate according to the second embodiment.

FIG. 14 is a flowchart illustrating a whole processing of estimating the diffusion coefficient change rate. The processing illustrated in FIG. 14 corresponds to a subroutine that is called and executed by ECU 100 with predetermined cycles.

Referring to FIG. 14, ECU 100 first determines whether a battery data storage completion flag is "on" or not, and thereby determines whether the new battery data for estimating the diffusion coefficient change rate is already stored or not (step S300). When the battery data is not yet stored (NO in S300), ECU 100 determines whether the conditions for starting the storage of the battery data for the diffusion coefficient change rate estimation are satisfied or not (step S310).

When the battery data storage completion flag is "on" (YES in S300), and the battery data for the diffusion coefficient change rate estimation is already stored, the process proceeds to step S390 to execute the estimation arithmetic processing for the diffusion coefficient change rate. The arithmetic processing performed in step S390 for estimating the diffusion coefficient change rate will be described later in detail.

ECU 100 determines in step S310 whether the storage start condition for the battery data is satisfied or not, or whether the data storage continuing flag is "on" or not.

The battery data storage start condition in step S310 is satisfied when it is determined that the relaxation state ends after secondary battery 10 continued this relaxation state for a predetermined time or more. For example, ECU 100 can determine that the battery is in the relaxation state when such a state continues for a predetermined time or more that the absolute value of measured battery current Ib is lower than a predetermined value and the maximum concentration difference (concentration difference in $c_{s,k}$ in the equation (8)) of the absolute value lower than a predetermined value is present in lithium concentration between the respective divided sections of N in number in the active material model. The end of the relaxation state can be determined when the above current absolute value condition or the above maximum lithium concentration difference condition is not satisfied. As will be described later, the data storage continuing flag is kept "on" during a period from the start of the data storage period to the end thereof.

When the storage start condition for the battery data is satisfied, or when the data storage is continuing after this battery data storage start condition was satisfied (YES in S310), ECU 100 stores present (current) battery temperature Tb, battery voltage Vb and battery current Ib in a data array storage region that is prepared in advance for storing the battery data. The battery current per unit plate can be obtained by dividing the current value measured by the current sensor by the double-sided plate area of the battery. Thus, battery data DT(n) Tb(n), Vb(n), Ib(n)) is stored according to the present outputs of sensors 20-40.

More preferably, the following configuration is employed. In addition to the storage of the battery data at and after the end of the relaxation state, the battery data for a predetermined time period before the end of the relaxation state is stored in the data array storage region, and the time preceding the time of the end of relaxation state by the predetermined time is handled as the "data storage start time". Thereby, the initialization of the battery model can be accurately performed using the battery data of the relaxed portion. The battery model initialization for estimating the diffusion coefficient change rate will be described later in detail.

When the determination result is NO in step S310, i.e., when the storage start condition for the battery data is not satisfied, ECU 100 ends the processing without storing the battery data.

A variable n is incremented by one every time the subroutine illustrated in FIG. 14 is executed, and the time-series data array is successively stored. The battery data array for storage is configured in advance to ensure the storage capacity of sizes that can store the battery data for the predetermined time length. Thereby, battery data DT(i) is successively and chronologically stored during the data storage period. Thus, the processing in steps S300-S320 corresponds to the function of estimation data storing unit 160 in FIG. 12.

In subsequent step S330, ECU 100 determines whether evaluation function arithmetic range Tic is present in the data storage period or not. The processing in step S330 corresponds to the function of evaluation function arithmetic range determining unit 170 in FIG. 12.

Figure 15:
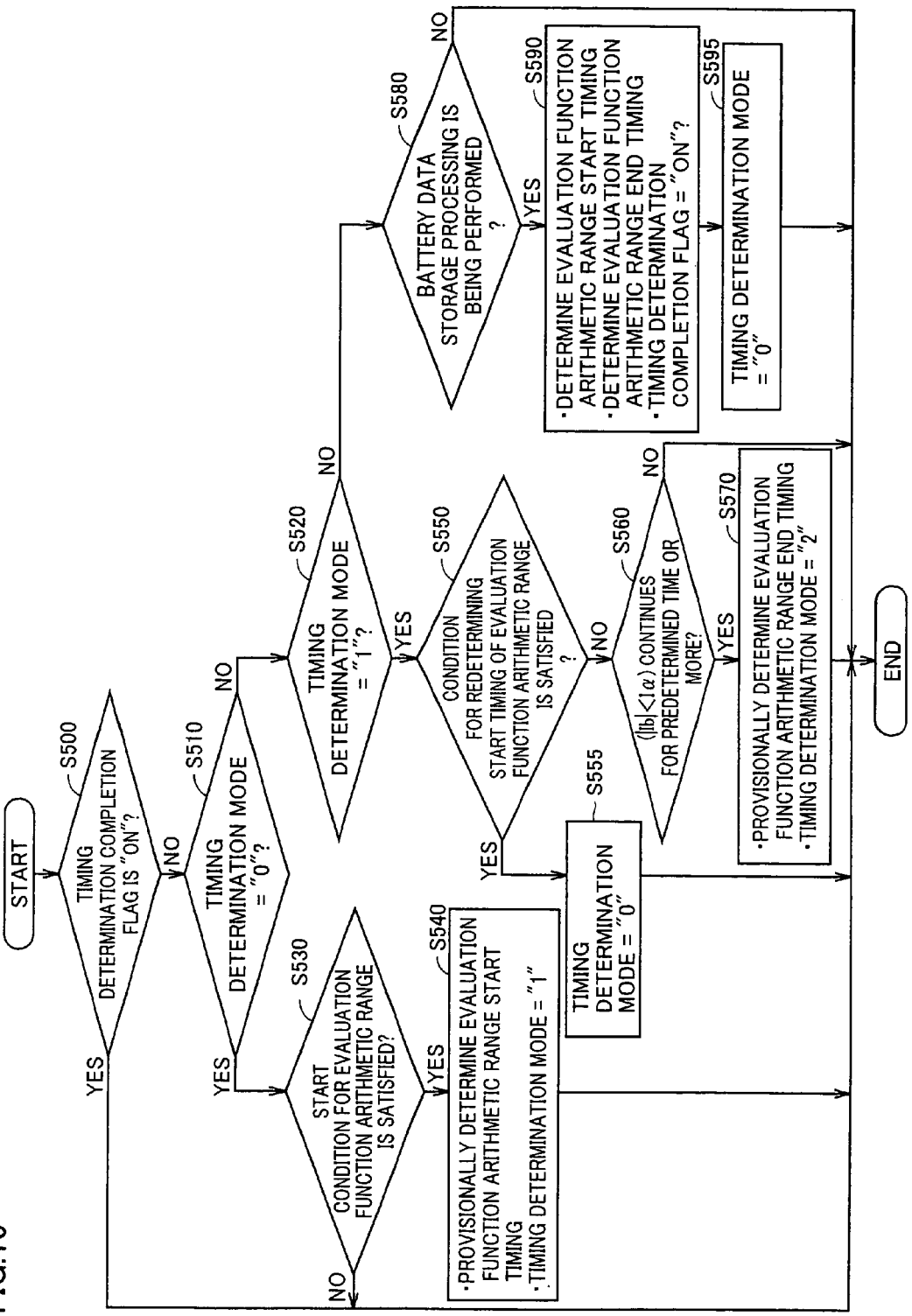
FIG. 15 is a flowchart illustrating details of processing of determining the evaluation function arithmetic range.

FIG. 15 is a flowchart specifically illustrating the determination processing for the evaluation function arithmetic range.

Referring to FIG. 15, ECU 100 first determines in step S500 whether a timing determination completion flag representing that the start timing of the evaluation function arithmetic range and the end timing thereof are already determined is "on" or not.

When the timing determination completion flag is "on" (YES in S500), the evaluation function arithmetic range is already fixed so that the subsequent processing is not executed. When the start timing and the end timing of the evaluation function arithmetic range are not yet fixed (NO in S500), ECU 100 determines in steps S510 and S520 whether the timing determination mode is "0", "1", or "2". This timing determination mode is set to "0" before the start condition for the evaluation function arithmetic range is satisfied and the start timing is provisionally determined. When the start timing is provisionally determined but the end condition is not satisfied so that the end timing is not yet determined, the timing determination mode is set to "1". When the end condition is satisfied after the timing determination mode was "1", the timing determination mode is set to "2". Thus, the state in which the evaluation function arithmetic range is determined is achieved when the timing determination mode attains "2".

When the timing determination mode is "0" (YES in S510), ECU 100 determines in step S530 whether the start condition for the evaluation function arithmetic range is satisfied or not. This start condition is satisfied when a difference of a predetermined value or more is present between the lithium concentration at the active material surface (interface to the electrolyte) obtained by the battery model equation and the average lithium concentration in the active material, and the battery current is in the charge state (Ib<0).

Whether the battery current is in the charge state or not also depends on the operation state of load 50 (FIG. 1) of secondary battery 10. Therefore, the determination whether the battery current is in the charge state or not may be performed based on the operation state of load 50 instead of battery current Ib. For example, when load 50 is an electric motor mounted on a hybrid vehicle, the determination that the battery current is in the charge state may be executed in response to execution of a regenerative braking operation.

When the start condition is established (YES in S530), ECU 100 provisionally determines and stores the present timing as the start timing of the evaluation function arithmetic range in step S540. Also, it changes the timing determination mode to "1".

When the timing determination mode is "0" and the start condition is not satisfied (NO in S530), the timing determination mode is kept at "0".

When the timing determination mode is "1", the determination results in steps S510 and S520 are NO and YES, respectively, so that ECU 100 executes the processing in steps S550-S570.

In step S550, ECU 100 determines whether the redetermination condition of the estimation arithmetic start timing is satisfied or not. When secondary battery 10 enters the charge state of a certain current or more after the start condition was satisfied in step S530, and the diffusion phenomenon starting from the satisfaction of the start condition is cancelled, the above redetermination condition is satisfied.

More specifically, even in the case where the start condition was once satisfied and, the timing determination mode attained "1" in step S530, ECU 100 returns the timing determination mode to "0" in step S555 when the redetermination condition is satisfied in step S550 (YES in S550). Thereby, the evaluation function arithmetic range start timing provisionally determined in step S540 is cancelled.

In the case where the redetermination condition is not satisfied in step S550 and the diffusion phenomenon starting from the time of satisfaction of the start condition is continuing after the timing determination mode attained "1", ECU 100 determines in step S560 whether battery current Ib has kept the absolute value smaller than a predetermined value Iα for a predetermined time or not. When the determination result in step S560 is YES, ECU 100 determines that the state in which the lithium diffusion in the secondary battery has proceeded without significantly changing the charge/discharge state of the secondary battery, i.e., the state suitable for the estimation of the diffusion coefficient has continued for a predetermined time or more after the satisfaction of the start condition, ECU 100 provisionally determines the present timing as the end timing of the evaluation function arithmetic range, and sets the timing determination mode to "2" in step S570.

When the timing determination mode is set to "2", ECU 100 executes the processing in steps S580-595 because the determination results in steps S510 and S520 are NO. In step S580, ECU 100 determines whether the processing of storing the battery data is being performed or not. When the processing of storing the battery data is being performed (YES in S580), ECU 100 determines the evaluation function arithmetic start timing provisionally determined in step S540 and the evaluation function arithmetic end timing provisionally determined in step S570 as the regular evaluation function arithmetic start timing and the regular evaluation function arithmetic end timing, respectively.

Thereby, in connection with variable n indicating an array number (time axis) of time-series battery data DT(n) stored in estimation data storing unit 160, ECU 100 stores (n=Ns) corresponding to the start timing of the evaluation function arithmetic range and (n=Ne) corresponding to the end timing thereof, and ends the determination of the evaluation function arithmetic range. Thereby, the timing determination completion flag is set to "on".

Further, ECU 100 returns the timing determination mode to "0", and returns the evaluation function arithmetic range determination processing to the initial state in step S595.

Referring to FIG. 14 again, after ECU 100 determined the evaluation function arithmetic range in step S330, it determines in step S340 whether the battery data storage processing is to be continued or not. In step S340, when the time elapsed from the start of storage of the battery data attains the predetermined value or more and the storage area for the battery data array is no longer present, or when a predetermined number of evaluation function arithmetic ranges Tlc can be ensured as a result of the processing of determining the evaluation function arithmetic range, the determination result in step S340 becomes NO, and the data storage continuing flag is set to "off" in step S360. Simultaneously, variable n indicating the array number at this point in time is set to Nend corresponding to the end point of the data string. The estimation data storing unit ends the battery data storing processing. In this stage, values of respective battery data items Tb, Vb and Ib within the data storage periods are stored as the time-series data array.

Conversely, when the determination result in step S340 is YES, ECU 100 keeps the data storage continuing flag at "on" in step S350, and ends the processing. In this case, the storage of the subsequent battery data will continue.

When the data storage continuing flag is set to "off", ECU 100 determines in step S370 whether the battery data already stored is available for the estimation of the diffusion coefficient change rate or not.

For example, even in the case where a predetermined time has elapsed after the start of the data storage period and thereby the data storage continuing flag is set to "off", the results of determination in step S370 is NO when the stored battery data does not include evaluation function arithmetic range Tlc. Thereby, ECU 100 sets the battery data storage completion flag to "off" in step S410. Consequently, the battery data that is currently stored is abandoned, and the request for storing the new battery data is issued without executing the subsequent estimation arithmetic processing for the diffusion coefficient change rate.

When the determination result in step S370 is YES, ECU 100 sets the battery data storage completion flag to "on". In step S390, ECU 100 executes the estimation arithmetic processing for the diffusion coefficient change rate, using the stored battery data array.

Figure 16:
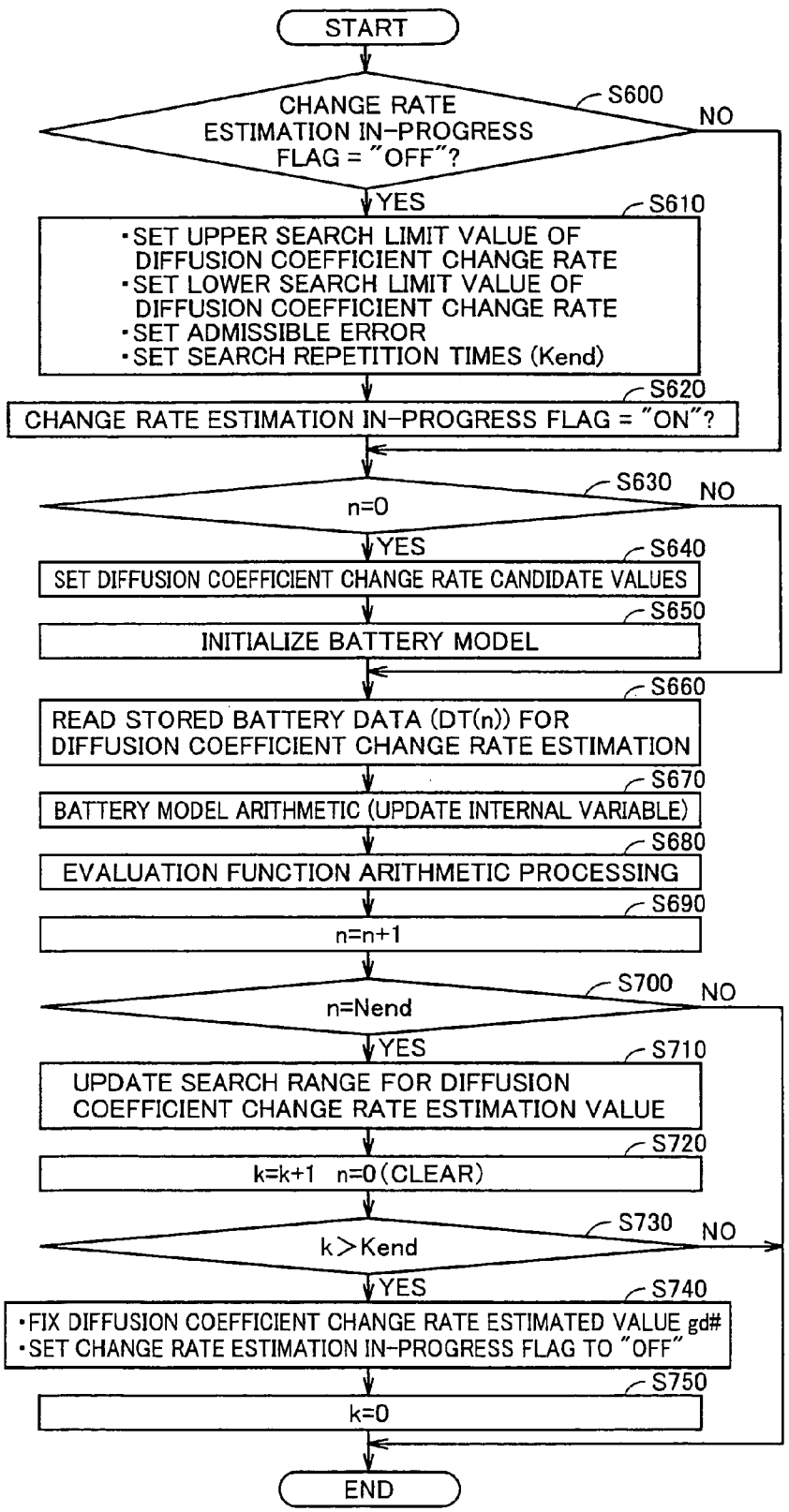
FIG. 16 is a flowchart illustrating details of the processing of determining the diffusion coefficient change rate estimation arithmetic range.

FIG. 16 illustrates details of the estimation arithmetic processing for the diffusion coefficient change rate in step S390. The arithmetic processing according to the flowchart of FIG. 16 is executed as a subroutine every time the processing is performed in step S390 illustrated in FIG. 14.

The arithmetic processing of estimating the diffusion coefficient change rate according to the second embodiment repeats the processing of searching for the change rate minimizing the evaluation function in evaluation function arithmetic range Tlc, using the stored battery data, and thereby sets the above change rate. This embodiment uses a GSM (Golden Section Method) which is a known method for searching for the diffusion coefficient change rate minimizing the evaluation function.

The GSM is a kind of half-split method, and has such a feature that the optimum value satisfying the admissible error can be obtained with a known search function by determining the search range and the admissible error. The lithium diffusion coefficient in the active material of the lithium-ion battery that will be attained after it is used under certain operation conditions for a certain operation period can be grasped in advance by a deterioration test and the like, and it is possible to predict a possible maximum extent or degree to which the diffusion coefficient will change from the initial state. Therefore, the maximum possible change range of the change rate is set as the search range, which offers an advantage that the arithmetic time required for estimating the diffusion coefficient change rate can be predicted. This is suitable for application to the secondary battery mounted on the hybrid vehicle and the electric vehicle. Details of the GSM method are well known, and therefore description thereof is not repeated.

As shown in FIG. 16, ECU 100 determines in step S600 whether the change rate estimation in-progress (or running) flag is "off" or not. When the determination result in step S600 is YES, i.e., at the start of the estimation processing for the diffusion coefficient change rate, ECU 100 sets the search range (upper and lower limits) and the admissible error of the diffusion coefficient change rate, and further sets a number Kend of search repetition times in the GSM in step S610. ECU 100 sets the change rate estimation in-progress flag to "on" in step S620. Therefore, the initial value setting processing in steps S610 and S620 will be skipped in later processing.

When the initial value setting processing ends, ECU 100 successively reads battery data DT(n) during the storage data period, and executes the change rate estimation processing. When the first battery data is read (i.e., n=0), the determination result in step S630 is YES, and ECU 100 sets the candidate values of the diffusion coefficient change rate determined by the GSM method for present evaluation in step S640. In step S650, ECU 100 reflects diffusion coefficient change rate gd that is set as the candidate in step S640 in the battery model according to the following equation (21), and initializes the state quantities (variables such as lithium concentration in the active material) in the battery model, using the voltage value in the first battery data.

$$\frac{\partial c_s}{\partial t} = gd \cdot D_{sn}(T) \cdot \left( \frac{\partial^2 c_s}{\partial r^2} + \frac{2}{r} \cdot \frac{\partial c_s}{\partial r} \right) \qquad (21)$$

In the processing of reading battery data DT(1) and subsequent data, the determination result in step S630 is NO so that the processing in steps S640 and S650 are skipped.

ECU 100 reads n-th battery data DT(n) in step S660, and calculates in step S670 battery current estimated value $I_{te}$ per unit plate area from the equations (1) and (7), using battery voltage Vb and battery temperature Tb in battery data DT(n) thus read as well as the lithium average concentration at the active material surface in the last arithmetic. By the battery arithmetic similar to that of battery model unit 115 already described, the internal state quantities (variables such as the lithium concentration distribution in the active material and the like) of the secondary battery are updated according to the equations (4)-(6) and (21). Thus, the arithmetic is executed according to the battery model equation using, as recursive inputs, the data array of the battery temperature and battery voltage in the battery data, and estimated value $I_{te}(n)$ of the battery current per unit plate area is successively calculated in time series.

In step S680, ECU 100 executes the arithmetic processing on the evaluation function according to the evaluation function arithmetic range. Evaluation function J is calculated from the following equation (22), where Ib(n) is a value per unit plate area and is obtained by conversion from measured value Ib(n).

$$J = \sum_{n=Ns}^{Ne} \{I_{te}(n) - Ib(n)\}^2 \qquad (22)$$

Thus, a square error between estimated value $I_{te}(n)$ of the battery current per unit plate area and the actual current value per unit plate area that is calculated by dividing measured value Ib(n) by the double-sided plate area is integrated in the evaluation function arithmetic range of n from Ns to Ne.

ECU 100 increments variable n to indicate battery data DT(n) to be used in the next subroutine processing. In step S700, it is determined whether variable n has reached Nend corresponding to the end of the battery data string stored in estimation data storing unit 160.

When the determination result in step S700 is YES, i.e., when the processing in steps S660-S680 is completed throughout the time range of the stored battery data, ECU 100 updates in step S710 the estimation value search range of the diffusion coefficient change rate for the next repetition according to the GSM method, using the value of evaluation function J.

In steps S720 and S730, ECU 100 repeats the series of foregoing processing over search repetition times of Kend. The estimated value search range is narrowed as the processing is repeated. When the repetition of the times of Kend is completed, ECU 100 fixes the central value in the search range as estimated value gd# of the diffusion coefficient change rate in step S740, and sets the change rate estimation in-progress flag to "off" in response to this fixing. In step S750, ECU 100 further clears a variable k indicating the number of repetitions to zero.

Referring to FIG. 14 again, when the change rate estimation in-progress flag is set to "off" after the arithmetic processing for estimating the diffusion coefficient change rate in step S390 (YES in S400), ECU 100 sets the battery data storage completion flag to "off" in step S410. Thereby, the battery data can be stored again when the storage start condition of the battery data is satisfied thereafter.

When the change rate estimation in-progress flag is "on" (NO in S400), ECU 100 keeps the battery data storage completion flag in the "on" state until the diffusion coefficient change rate estimation arithmetic processing is completed. Diffusion coefficient change rate estimated value gd# estimated by the above change rate estimation processing can be used for determining the degree of deterioration of the diffusion resistance in the secondary battery. Diffusion resistance change rate likewise represents the change rate of diffusion coefficient D, affected by the secular change, i.e., the battery deterioration degree itself. Therefore, the degree of deterioration of secondary battery 10 can be estimated directly and easily according to this estimated value gd#.

Figure 17:
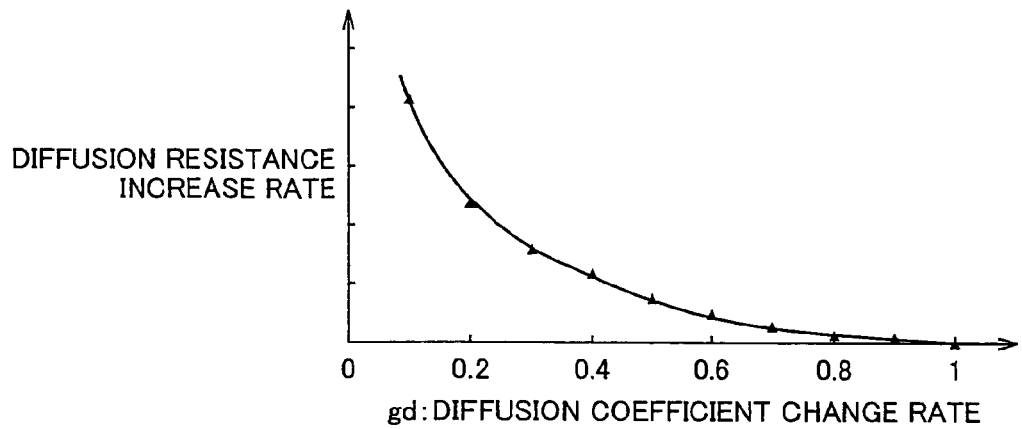
FIG. 17 conceptually shows an example of a correlation between the diffusion coefficient change rate and the diffusion resistance increase rate.

For example, as shown in FIG. 17, a relationship between diffusion coefficient change rate gd and the increasing rate of the diffusion resistance may be obtained in advance by an experiment or the like, and may be prestored as a map. Thereby it is possible to grasp a degree of increase in diffusion coefficient according to the diffusion coefficient change rate estimated value thus estimated. The diffusion resistance can be actually measured as follows. A magnitude of voltage lowering or rising that occurs immediately after the discharge or the charge (i.e., a magnitude of voltage lowering or rising due to the DC resistance) is subtracted from the behaviors of the battery current and battery voltage that are determined after charge or discharge with a certain current was performed for a predetermined time (e.g., 10 seconds), i.e., from the magnitude of the voltage lowering or the voltage rising. The result of this subtraction is divided by the battery current. Thereby, the above actual measurement can be performed.

In another method, the diffusion resistance can be directly obtained as follows. The voltage attained when the discharge or charge with a certain current was performed for a predetermined time (e.g., about 10 seconds) is arithmetically obtained, using the estimated diffusion coefficient change rate and the battery model. The magnitude of the voltage lowering due to the diffusion is calculated similarly to the above from the voltage value thus obtained arithmetically, and the obtained result is divided by the current value used in the above arithmetic so that the above diffusion resistance can be directly obtained. Further, the diffusion coefficient change rate may be set to one, and the initial resistance may be obtained using the initial diffusion coefficient and the battery model similarly to the above. The increasing rate (change rate) of the diffusion resistance can also be obtained by dividing the initial diffusion resistance by the diffusion resistance that is attained in the deteriorated state and is obtained as described above. In this manner, the increasing rate of the diffusion resistance can be obtained without additionally employing a map representing the relationship between the diffusion coefficient change rate and the diffusion resistance increasing rate.

Thus, the structure in FIG. 12 may be further provided with deterioration degree estimating unit 150 similar to that in FIG. 7, and may be configured to determine the degree of deterioration of secondary battery 10 according to estimated value gd# of the diffusion resistance change rate thus calculated.

Diffusion coefficient change rate estimated value gd# is substituted for gd in the above equation (21), and thereby can be reflected in the in-active-material diffusion equation in the battery model equation. Thereby, even when the diffusion resistance changes due to the secular change of the battery, and the state quantities (typically, the SOC) of the secondary battery can be accurately estimated.

Similarly to diffusion coefficient $D_s$ depending on the temperature, the change rate, i.e., the rate of change from the value in the initial value may depend on the temperature although this temperature dependence is smaller than that of the diffusion coefficient.

Therefore, it is preferable that diffusion coefficient change rate gd is determined in each battery temperature area independently of the other battery temperature areas. For example, estimated value gd# of the diffusion coefficient change rate is stored in a map (diffusion coefficient change rate map) with respect to the battery temperature, the diffusion coefficient change rate corresponding to present battery temperature Tb is calculated from the diffusion coefficient change rate map, using the output of temperature sensor 40, and the arithmetic is performed by battery model unit 115 according to the equation (21).

Figure 18:
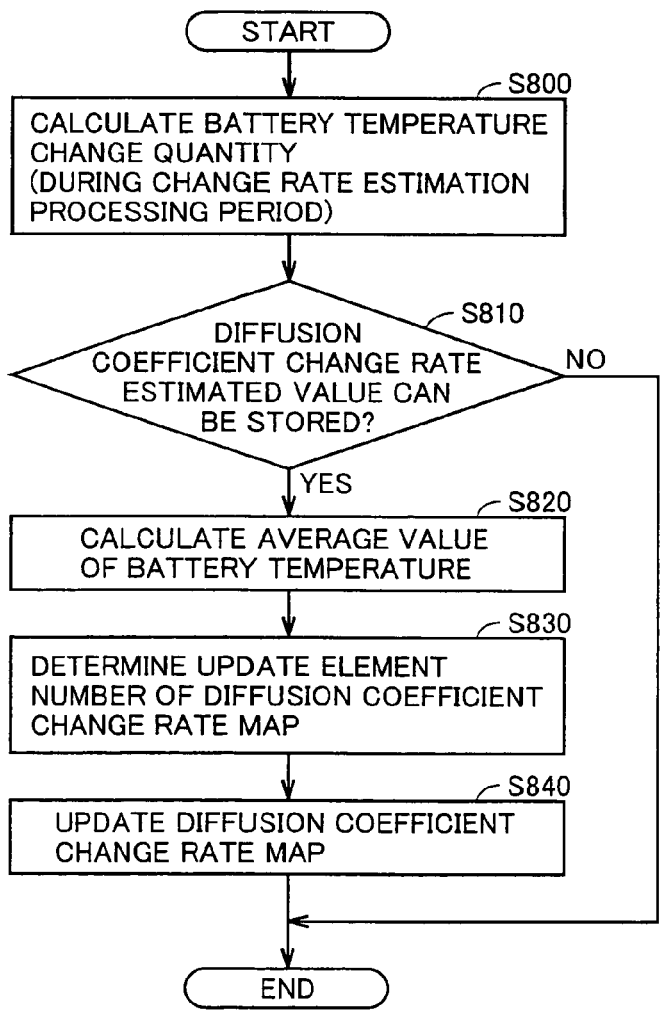
FIG. 18 is a flowchart illustrating processing of storing and updating a diffusion coefficient change rate map.

A method of storing and updating the diffusion coefficient change rate map will now be described by way of example with reference to FIGS. 18 and 19. FIG. 18 shows a flowchart of the processing of storing and updating the diffusion coefficient change rate map.

Figure 19:
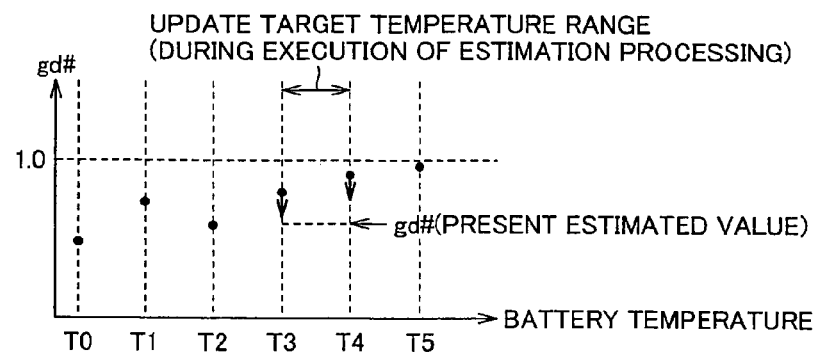
FIG. 19 conceptually illustrates a structural example of the diffusion coefficient change rate and an example of update of map values.

FIG. 19 shows an structural example of the diffusion coefficient change rate map in which map values are set corresponding to battery temperatures T0-T5. In the initial state, all the map values of the diffusion coefficient change rate are 1.0 in all the temperature areas, and thus are equal to the value of diffusion coefficient $D_s$ in the initial state.

Referring to FIG. 18, ECU 100 calculates the change quantity of the battery temperature during the data storage period used for the estimation arithmetic of the diffusion coefficient change rate, i.e., the change quantity of the battery temperature between battery temperature Tb(0) and Tb(Nend) in step S800.

In step S810, ECU 100 determines according to the change quantity of the battery temperature obtained in step S800 whether the diffusion coefficient change rate that is currently estimated is to be stored in the diffusion coefficient change rate map or not. For example, when the absolute value of the battery temperature change rate is larger than a predetermined value (NO in S810), ECU 100 does not store the estimated diffusion coefficient change rate gd# in the map, and ends the processing.

When the battery temperature change quantity is smaller than the predetermined value (NO in S810), ECU 100 calculates the average value of battery temperatures Tb(0)-Tb(Nend) in step S820, and then determines an update element number on the diffusion coefficient change rate map corresponding to the battery temperature average value thus calculated in step S830. ECU 100 updates the map value of the diffusion coefficient change rate corresponding to the determined update element number in step S840.

Referring to FIG. 19, when the battery temperature average value calculated in step S120 is, e.g., between battery temperatures T3 and T4, the map values of the diffusion coefficient change rate corresponding to battery temperature T3 and T4 are updated according to present estimated value gd#. For example, ECU 100 updates the map value to a value obtained by weighted average between the last stored map value and diffusion coefficient change rate gd# that is currently estimated.

FIGS. 20 to 23 show, by way of example, experiment results exhibited when the diffusion coefficient change rate is estimated and learned using data obtained by charging and discharging the secondary battery under a predetermined load.

Figure 20:
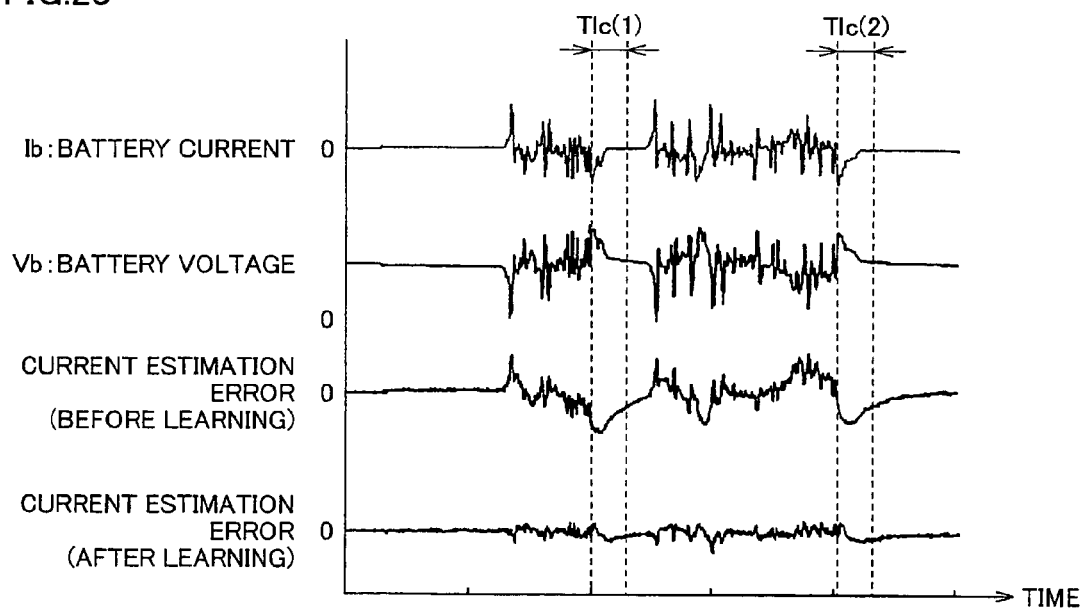
FIG. 20 is a first diagram showing an example of an experiment result of estimation of the diffusion coefficient change rate according to the second embodiment.

FIG. 20 shows, on the same time base, the changes or transitions in battery current Ib (measured value) and battery voltage Vb (measured value) in the stored data range as well as changes or transitions of the estimation error ($I_{te}$–Ib) of the battery current. It can be understood from FIG. 20 that evaluation function arithmetic ranges Tlc(1) and Tlc(2) for calculating evaluation function J are set in periods, in which the current behaviors are stable after the charging of the secondary battery, within the storage data period.

FIG. 20 shows in parallel the current estimation error exhibited after the learning, i.e., in the case where the battery model arithmetic is executed with estimated value gd# of the diffusion coefficient change rate reflected in it as well as the current estimation error exhibited before the learning, i.e., in the case where the battery model arithmetic is executed without estimating the diffusion coefficient change rate. As can be understood from the comparison between them, the evaluation function is calculated from the square error of the current estimation in the evaluation function arithmetic range, and the diffusion coefficient change rate minimizing the calculated value of the above evaluation function is estimated and reflected in the battery model equation. Thereby, the current estimation error becomes small, i.e., the estimation accuracy for the internal behavior of the secondary battery is improved.

Figure 21:
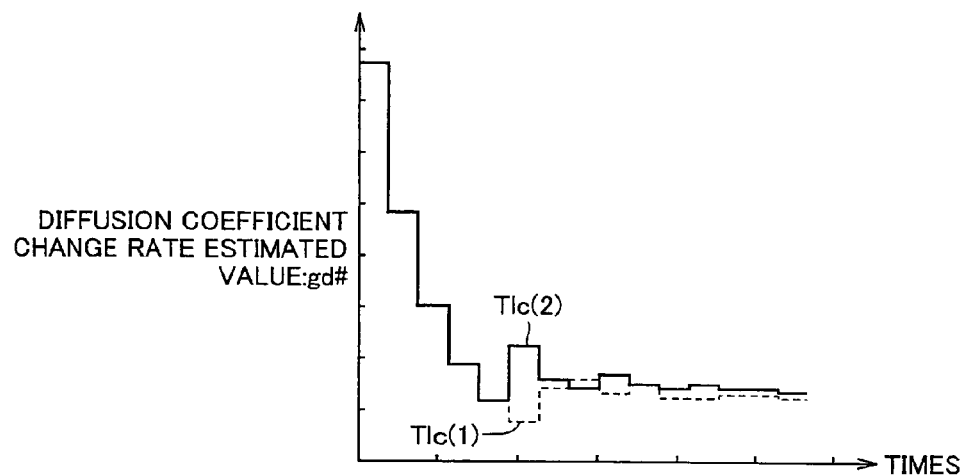
FIG. 21 is a second diagram showing an example of the experiment result of estimation of the diffusion coefficient change rate according to the second embodiment.

FIG. 21 shows a manner in which the estimated value of the diffusion coefficient change rate converges with repetition of the search. As the times of repetition of the search increase, estimated value gd# of the diffusion coefficient change rate converges to the value matching with the present battery state. In either of the cases where evaluation function arithmetic ranges Tlc(1) and Tlc(2) are used, respectively, estimated value gd# converges to the same value. Thus, it can be understood that the estimation result of the diffusion coefficient change rate is reproducible regardless of the specific evaluation function arithmetic range to be used, as long as the start/end timing of the evaluation function arithmetic range described above is satisfied.

Figure 22:
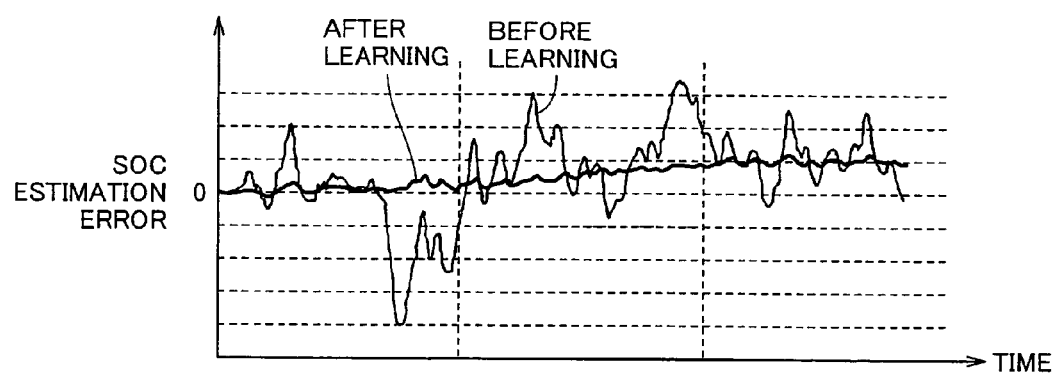
FIG. 22 is a third diagram showing an example of the experiment result of estimation of the diffusion coefficient change rate according to the second embodiment.

FIG. 22 shows a manner of the SOC estimation in the case where diffusion coefficient change rate is estimated and learned using the secondary battery that has already deteriorated with time. In the case where the diffusion coefficient of the lithium in the active material decreases from that in the initial state due to the battery deterioration, the change rate estimation error becomes large when the estimation learning is not performed (before learning), but the change rate estimation error becomes small when the learning is performed by estimating the diffusion coefficient change rate and reflecting it in the battery model (after the learning).

Third Embodiment

As described above, the processing of estimating the DC resistance change rate in accordance with the block diagram of FIG. 7 and the processing of estimating the diffusion coefficient change rate in accordance with the block diagram m of FIG. 12 can be executed independently of each other by ECU 100. Therefore, the state estimating device of the secondary battery can be configured to execute in parallel the estimation of the DC resistance change rate according to the first embodiment and the estimation of the diffusion coefficient change rate according to the second embodiment. According to this configuration, the battery behaviors (typically, the SOC) can be accurately estimated even in the secondary battery having both the DC resistance and the diffusion resistance that have increased due to the deterioration. The deterioration of the DC resistance can be detected independently of the deterioration of the diffusion resistance.

However, when the estimation of the DC resistance change rate and the estimation of the diffusion coefficient change rate are executed in parallel according to the same timing, the following processing can be performed for suppressing the interference between them.

In a first example, during the data storage period for the diffusion coefficient change rate, the variation quantity over the data storage period is obtained from the estimated value of DC resistance change rate gr (or gr1 and gr2) and/or the estimated value of the SOC. When the change quantity thus obtained is larger than a predetermined value, it is possible to stop the use of the battery data over the above data storage period in the estimation of the diffusion coefficient change rate. In this case, large changes occur in DC resistance so that the provision of the above restrictions can prevent erroneous estimation of the DC resistance changes as the diffusion resistance changes (i.e., changes in diffusion coefficient). Thereby, both the DC resistance change rate and the diffusion coefficient change rate can be accurately estimated.

The above restrictions can be achieved by adding the determination condition for providing the determination result of "NO" when changes of a predetermined value or more in quantity occur in DC resistance change rate estimated value and/or SOC estimated value in the determination at step S370 in FIG. 14.

As a second example, the following configuration may be employed. The DC resistance change rate used in battery model arithmetic unit 220 for the diffusion coefficient change rate estimation is fixed to the value equal to that at the start of the data storage period, and the battery model arithmetic (step S670 in FIG. 16) is performed with the fixed value in the subsequent data storage periods. This configuration can prevent the occurrence of the estimation error due to interference between the change rate estimation results, and allows accurate estimation of both the DC resistance change rate and the diffusion coefficient change rate.

As a third example, the following configuration may be employed. In parallel with the storage of the battery data during the data storage period, the average value of the estimated values of DC resistance change rate gr (or gr1 and gr2) is obtained, the DC resistance change rate used by battery model arithmetic unit 220 for estimating the diffusion coefficient change rate is fixed to this average value, and the battery model arithmetic (step S670 in FIG. 16) during the subsequent data storage periods is executed with the DC resistance change rate thus fixed. This configuration can prevent the occurrence of the estimation error due to the interference between the change rate estimation results, and allows accurate estimation of both the DC resistance change rate and the diffusion coefficient change rate.

(Modification of the Battery Model Equation)

In the battery model equations used in the first to third embodiments already described, a single spherical model having the averaged characteristics at negative electrode 12 and positive electrode 15 is used as the active material model common to the positive electrode and negative electrode for reducing the arithmetic load. However, different spherical active material models may be set for negative electrode 12 and positive electrode 15, respectively, and the diffusion equation of the lithium in the active material may be solved.

When the above structure is employed, the lithium concentration distribution in the active material can be calculated for each of negative electrode 12 and positive electrode 15 independently of the other, and thereby the local SOC at the active material surface can be calculated for each of negative electrode 12 and positive electrode 15. Thus, the diffusion process of the active material in each of negative electrode 12 and positive electrode 15 can be modeled. Thereby, the battery behaviors can be estimated more accurately.

According to the battery model in which the independent spherical active material model is set for each of negative electrode 12 and positive electrode 15, $\theta 1$ and $\theta 2$ that are local SOCs of the negative electrode and positive electrode, respectively, can be defined by the following equation (2'):

$$\theta 1 = \frac{c_{se,1}}{c_{s1,max}}, \theta 2 = \frac{c_{se,2}}{c_{s2,max}} \qquad (2')$$

where $c_{se,1}$ and $c_{sc,2}$ indicate average lithium concentrations at the active material surfaces (the interface to the electrolyte) of positive electrode 15 and negative electrode 12, respectively, and $c_{s1,max}$ and $c_{s2,max}$ indicate maximum lithium concentrations of positive electrode 15 and negative electrode 12, respectively.

When the above model is used, open-circuit voltage U is represented by the following equation (23):

$$U = U1(\theta 1) - U2(\theta 2) \qquad (23)$$

where U1 is the Open-Circuit Voltage (OCP) of the positive electrode, and U2 is the open-circuit voltage of the negative electrode. Open-circuit voltages U1 and U2 are functions of local SOCs $\theta 1$ and $\theta 2$ at the active material surfaces, respectively.

For open-circuit voltages U1 and U2, the characteristic map can be prepared in advance based on the measured values. Thereby, the open-circuit voltages can be calculated based on the lithium concentration distributions at negative electrode 12 and positive electrode 15 that are arithmetically obtained from the battery model equations.

As described above, even in the case where the lithium concentrations at negative electrode 12 and positive electrode 15 are calculated according to the respective active material models, the SOC and the battery current can be estimated from battery voltage Vb and battery temperature Tb similarly to the battery model equation already described by obtaining the open-circuit voltage according to the equation (23). Therefore, the DC resistance change rate or the change rates of the charge-transfer resistance and the pure resistance can be estimated similarly.

Further, when the battery deteriorates, the lithium diffusion coefficient in the active material may change due to deterioration. Therefore, it is desired to estimate the change rates of the respective lithium diffusion coefficients of negative electrode 12 and positive electrode 15. However, the change in diffusion coefficient of one of the positive electrode and negative electrode due to the deterioration may be predominant over that of the other (e.g., when the deterioration does not significantly change the diffusion coefficient of the negative electrode but significantly changes the diffusion coefficient of the positive electrode). In this case, the diffusion coefficient changed to a smaller extent is set to the same value (fixed value) as that in the initial state (e.g., in the new state), and the change rate of only the diffusion coefficient changed to a large extent due to the deterioration is estimated. By this configuration, it is possible to employ the estimation method for the diffusion coefficient change rate described in the second embodiment.

By reflecting the diffusion coefficient change rate thus estimated in the battery model used for the change rate estimation, the SOC and the current estimated value can be accurately calculated even when the lithium diffusion coefficient in the active material changes due to the deterioration.

In the embodiment already described, the secondary battery has been described as the lithium-ion battery, the state estimating device of the secondary battery according to the invention can be applied to second batteries other than the lithium-ion battery without specifically limiting the type of the load. For example, in the nickel hydrogen battery, a concentration distribution of protons handled as a reaction-participating material in the active material is calculated from the diffusion equation, and the open-circuit voltage is defined as a function of the protons at the surface of the active material. Thereby, the method of the invention can likewise be employed. For other kinds of secondary batteries, the device may be configured to estimate a rate of change of a predetermined parameter in a similar battery model equation from that in the initial state, and this configuration can achieve similar effects.

Although the present invention has been described and illustrated in detail, it is clearly understood that the same is by way of illustration and example only and is not to be taken by way of limitation, the scope of the present invention being interpreted by the terms of the appended claims.

INDUSTRIAL APPLICABILITY

The invention can be applied to the power supply system provided with the chargeable and dischargeable secondary battery supplying the power to the load.

The invention claimed is:

1. A state estimating device of a secondary battery, comprising:
    a detecting unit for detecting a voltage, a current and a temperature of said secondary battery;
    a battery state estimating unit successively estimating a state quantity of said secondary battery according to a battery model equation based on at least one of the battery temperature and the battery voltage, and the battery current detected by said detecting unit;
    a storing unit prestoring data relating to change characteristics of an initial state parameter value of said secondary battery with respect to changes in battery state in connection with a predetermined parameter of parameters used in said battery model equation; and
    a change rate estimating unit estimating a parameter change rate being a ratio of a present parameter value with respect to said initial state parameter value in connection with said predetermined parameter, wherein
    said change rate estimating unit performs parameter identification based on said battery model equation using said battery temperature, said battery voltage and said battery current detected by said detecting unit as well as said initial state parameter value corresponding to the present battery state based on the data read from said storing unit, and thereby estimates said parameter change rate.

2. The state estimating device of the secondary battery according to claim 1, wherein
    said battery state estimating unit executes the estimation of the state quantity of said secondary battery according to said battery model equation, for said predetermined parameter in said battery model equation, using values obtained by multiplying said parameter change rate estimated by said change rate estimating unit by said initial state parameter value corresponding to said battery state.

3. The state estimating device of the secondary battery according to claim 1, further comprising:
    a deterioration degree estimating unit estimating a degree of deterioration of said secondary battery based on said parameter change rate estimated by said change rate estimating unit.

4. The state estimating device of the secondary battery according to claim 1, wherein
    said predetermined parameter is a parameter expressing a DC resistance of said secondary battery, and
    said change rate estimating unit successively estimates said parameter change rate by using, as its input/output, a state quantity obtained from said battery model equation and from said battery temperature, said battery current and said battery voltage detected by said detecting unit, and by employing a least-square method in a linear regression model equation using said parameter change rate as an estimation parameter.

5. The state estimating device of the secondary battery according to claim 4, wherein
    said change rate estimating unit estimates said parameter change rate by a recursive least-square method employing a forgetting coefficient for reducing a weight of past data relatively to that of present data.

6. The state estimating device of the secondary battery according to claim 4, wherein
    said change rate estimating unit stops the estimation of said parameter change rate when an absolute value of said battery current detected by said detecting unit is larger than a first reference value or when the absolute value of said battery current is smaller than a second reference value smaller than said first reference value.

7. The state estimating device of the secondary battery according to claim 4, wherein
    the parameter expressing said DC resistance is represented as a function of said battery temperature and a local SOC based on an estimated value of a reaction-participating material concentration at an interference of an active material in an electrode of said secondary battery estimated by said battery state estimating unit.

8. The state estimating device of the secondary battery according to claim 4, wherein
    the parameter expressing said DC resistance includes a charge-transfer resistance and a pure electric resistance inside said secondary battery, and
    said change rate estimating unit successively estimates said parameter change rates of said charge-transfer resistance and said electric resistance independently of each other.

9. The state estimating device of the secondary battery according to claim 4, wherein
    said battery model equation includes:
    a voltage equation expressed by an open-circuit voltage being a function of a reaction-participating material concentration at a surface of an active material inside said secondary battery and an overvoltage depending on the current, and
    a diffusion equation defining a distribution of said reaction-participating material concentration inside said active material.

10. The state estimating device the secondary battery according to claim 9, wherein
    said change rate estimating unit stops the estimation of said parameter change rate when an absolute value of a difference between said reaction-participating material concentration at the surface of said active material and an average value of the reaction-participating material concentration inside said active material is larger than a predetermined value, or before a predetermined time elapses after the absolute value of the concentration difference becomes smaller than said predetermined value.

11. The state estimating device of the secondary battery according to claim 1, wherein said predetermined parameter includes a diffusion parameter expressing a diffusion speed of a reaction-participating material in an active material of said secondary battery;

said state estimating device further comprises:

an estimation data storing unit for successively storing, as a time-series data array, said battery data of each of said battery voltage, said battery current and said battery temperature detected by said detecting unit during a data storage period defined according to a predetermined condition; and said change rate estimating unit includes:

a battery model arithmetic unit for obtaining a time-series estimated data string relating to predetermined battery data by performing arithmetic corresponding to said data storage period and according to said battery model equation handling said data array of the battery data as recursive inputs, and an estimation processing unit estimating the parameter change rate of said diffusion parameter based on a comparison between said estimated data string obtained by said battery model arithmetic unit and the data string of said predetermined battery data stored in said estimation data storing unit.

12. The state estimating device of the secondary battery according to claim 11, wherein said estimation data storing unit starts said data storage period according to satisfaction of a predetermined storage start condition, and ends said data storage period according to satisfaction of a predetermined storage end condition;

said state estimating device further comprises an evaluation function arithmetic range determining unit for determining, from said data storage period, an evaluation function arithmetic range representing a time range used for estimating said parameter change rate;

said battery model arithmetic unit executes arithmetic according to said battery model equation, for said diffusion parameter, using a value obtained by multiplying a candidate value of said parameter change rate by said initial state parameter value corresponding to the battery state at each point in time to be subjected to said arithmetic; and said estimation processing unit includes:

an evaluation function arithmetic unit calculating an evaluation function corresponding to said evaluation function arithmetic range determined by said evaluation function arithmetic range determining unit, relating to said predetermined battery data, based on an error between an value of said estimated data string obtained by said battery model arithmetic unit and a value of said data string, and an estimation processing control unit successively selecting a plurality of said candidate values, and estimating the parameter change rate of said diffusion parameter based on a comparison between the evaluation functions calculated with respect to said candidate values, respectively.

13. The state estimating device of the secondary battery according to claim 12, wherein said battery model arithmetic unit obtains said time-series estimated data string relating to said battery current by performing arithmetic corresponding to said data storage period and according to said battery model equation using said data array of said battery voltage and said battery temperature as its recursive inputs, and said evaluation function arithmetic unit obtains said evaluation function by integrating a square error between a value of the estimated data string and a value of said battery data array relating to said battery current, corresponding to said evaluation function arithmetic range.

14. The state estimating device of the secondary battery according to claim 12, wherein said diffusion parameter is represented as a function of said battery temperature.

15. The state estimating device of the secondary battery according to claim 12, wherein said estimation data storing unit determines that said storage start condition is satisfied, in response to a relaxation state of said secondary battery.

16. The state estimating device of the secondary battery according to claim 11, wherein said battery model equation includes:

a voltage equation expressed by an open-circuit voltage being a function of a reaction-participating material concentration at a surface of an active material inside said secondary battery and an overvoltage depending on the current, and a diffusion equation defining a distribution of said reaction-participating material concentration inside said active material.

17. The state estimating device of the secondary battery according to claim 16, wherein said estimation data storing unit determines that said storage start condition is satisfied, when such a state continues for a predetermined time or more that an absolute value of said battery current detected by said detecting unit is smaller than a predetermined value, and a maximum concentration difference in a distribution of said reaction-participating material concentration inside said active material estimated by said battery state estimating unit is smaller than a predetermined value.

18. The state estimating device of the secondary battery according to claim 16, wherein said evaluation function arithmetic range determining unit determines, as a start time, a point in time during said data storage period when said secondary battery is in a charged state and a concentration difference of a predetermined value or more in absolute value occurs between said reaction-participating material concentration at the surface of said active material and an average value of the reaction-participating material concentration inside said active material in estimation by said battery state estimating unit, determines, as an end time, a point in time during said data storage period when said battery current continuously takes an absolute value smaller than a predetermined value for a predetermined time or more thereafter, and determines a time range from said start time to said end time as said evaluation function arithmetic range when a discharge current of a predetermined value or more has not occurred during the period from said start time to said end time.

19. The state estimating device of the secondary battery according to claim 18, wherein said change rate estimating unit inhibits setting of the new data storage period by said estimation data storing unit during the estimation processing for said parameter change rate, and allows setting of said new data storage period at the end of said data storage period without executing the estimation processing for said parameter change rate when said time range to be determined as said evaluation function arithmetic range is not present within said data storage period.

20. The state estimating device of the secondary battery according to claim 12, wherein said estimation processing control unit executes setting of said plurality of candidate values of said parameter change rate and fixing of the estimated value of said parameter change rate, based on search according to a golden selection method.

21. The state estimating device of the secondary battery according to claim 11, wherein said predetermined parameter further includes a resistance parameter expressing a DC resistance of said secondary battery, and said change rate estimating unit further includes a DC resistance change rate estimating unit successively estimating a parameter change rate of said resistance parameter by using, as its input/output, a state quantity, obtained from said battery model equation and from said battery temperature, said battery current and said battery voltage detected by said detecting unit, and by employing a least-square method in a linear regression model equation using said parameter change rate as an estimation parameter.

22. The state estimating device of the secondary battery according to claim 21, wherein said battery state estimating unit executes the estimation of the state quantity of said secondary battery according to said battery model equation, for each of said diffusion parameter and said resistance parameter in said battery model equation, using values obtained by multiplying said parameter change rate successively estimated by said change rate estimating unit and said initial state parameter value corresponding to the present battery state based on the data read from said storing unit.

23. The state estimating device of the secondary battery according to claim 21, wherein said change rate estimating unit inhibits the use of said battery data array during said data storage period for estimating the parameter change rate of said diffusion parameter when a change of a predetermined value or more occurs in said parameter change rate estimated by said DC resistance change rate estimating unit or in the SOC of said secondary battery.

24. The state estimating device of the secondary battery according to claim 21, wherein said battery model arithmetic unit executes the arithmetic according to said battery model equation using, for said resistance parameter in said battery model equation, a product of said fixed parameter change rate and said initial state parameter value corresponding to the battery state at each point in time to be subjected to said arithmetic.

25. The state estimating device of the secondary battery according to claim 21, wherein said battery model arithmetic unit executes the arithmetic according to said battery model equation using, for said resistance parameter in said battery model equation, a value obtained by multiplying the average value of said parameter change rate successively estimated by said DC resistance change rate estimating unit during said data storage period by said initial state parameter value corresponding to the battery state at each point in time to be subjected to said arithmetic.

* * * * *